United States Patent
Sirringhaus et al.

(10) Patent No.: US 10,573,759 B2
(45) Date of Patent: Feb. 25, 2020

(54) ORGANIC POLYMER GATE DIELECTRIC MATERIAL FOR TRANSISTOR DEVICES

(71) Applicant: CAMBRIDGE ENTERPRISE LIMITED, Cambridge (GB)

(72) Inventors: Henning Sirringhaus, Cambridge (GB); Kal Banger, Cambridge (GB); Vincenzo Pecunia, Marsala (IT)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 48 days.

(21) Appl. No.: 15/520,574

(22) PCT Filed: Oct. 20, 2015

(86) PCT No.: PCT/EP2015/074264
§ 371 (c)(1),
(2) Date: Apr. 20, 2017

(87) PCT Pub. No.: WO2016/062715
PCT Pub. Date: Apr. 28, 2016

(65) Prior Publication Data
US 2018/0337287 A1 Nov. 22, 2018

(30) Foreign Application Priority Data
Oct. 20, 2014 (GB) .................................. 1418610.0

(51) Int. Cl.
*H01L 21/00* (2006.01)
*H01L 29/08* (2006.01)
(Continued)

(52) U.S. Cl.
CPC .. *H01L 29/78693* (2013.01); *H01L 21/02118* (2013.01); *H01L 21/02282* (2013.01);
(Continued)

(58) Field of Classification Search
CPC ......... H01L 29/78391; H01L 21/02118; H01L 21/02282; H01L 21/02565;
(Continued)

(56) References Cited

U.S. PATENT DOCUMENTS

2004/0002176 A1   1/2004  Xu
2005/0274986 A1* 12/2005  Sirringhaus ............ B82Y 30/00
257/213

(Continued)

FOREIGN PATENT DOCUMENTS

JP    2007-258282 A   10/2007
JP    2010-251591 A   11/2010

OTHER PUBLICATIONS

International Search Report for application No. PCT/EP2015/074264 dated Apr. 20, 2016.
(Continued)

*Primary Examiner* — Alonzo Chambliss
(74) *Attorney, Agent, or Firm* — Sughrue Mion, PLLC

(57) ABSTRACT

A transistor device comprising an inorganic oxide semiconductor channel having a channel length L and a channel width W between source and drain conductors and capacitively coupled to a gate conductor via an organic polymer dielectric in contact with the inorganic oxide semiconductor channel. The gate voltage required to maintain a constant current of at least X nA between the source and drain conductors over a period of 14 hours while the gate and drain conductors are maintained at the same electric potential, varies by less than 1V, preferably less than about 0.2V; wherein X equals the W/L ratio multiplied by 50.

3 Claims, 17 Drawing Sheets

(51) Int. Cl.
*H01L 33/00* (2010.01)
*H01L 31/0232* (2014.01)
*H01L 29/786* (2006.01)
*H01L 29/49* (2006.01)
*H01L 29/66* (2006.01)
*H01L 29/78* (2006.01)
*H01L 21/02* (2006.01)
*H01L 21/445* (2006.01)
*H01L 27/28* (2006.01)
*H01L 27/32* (2006.01)
*H01L 29/51* (2006.01)
*H01L 51/00* (2006.01)
*H01L 51/05* (2006.01)

(52) U.S. Cl.
CPC .. *H01L 21/02565* (2013.01); *H01L 21/02628* (2013.01); *H01L 21/445* (2013.01); *H01L 27/283* (2013.01); *H01L 27/286* (2013.01); *H01L 27/3262* (2013.01); *H01L 29/4908* (2013.01); *H01L 29/516* (2013.01); *H01L 29/66969* (2013.01); *H01L 29/78391* (2014.09); *H01L 29/78696* (2013.01); *H01L 51/0097* (2013.01); *H01L 51/052* (2013.01); *H01L 51/0541* (2013.01); *H01L 2227/323* (2013.01)

(58) Field of Classification Search
CPC ............. H01L 21/02628; H01L 21/445; H01L 27/283; H01L 27/286; H01L 27/3262; H01L 29/4908; H01L 29/516
See application file for complete search history.

(56) References Cited

U.S. PATENT DOCUMENTS

| | | | |
|---|---|---|---|
| 2006/0284166 A1* | 12/2006 | Chua | C07C 247/16 257/40 |
| 2006/0284171 A1 | 12/2006 | Levy et al. | |
| 2010/0120197 A1 | 5/2010 | Levy et al. | |
| 2012/0326149 A1* | 12/2012 | Ng | H01L 29/7869 257/57 |
| 2013/0196469 A1 | 8/2013 | Facchetti et al. | |
| 2013/0217180 A1 | 8/2013 | Facchetti et al. | |
| 2013/0240881 A1 | 9/2013 | Nakamura et al. | |
| 2013/0270534 A1 | 10/2013 | Hwang et al. | |
| 2014/0217395 A1 | 8/2014 | Facchetti et al. | |
| 2014/0299877 A1* | 10/2014 | Nakamura | H01L 29/7869 257/43 |
| 2015/0122334 A1 | 5/2015 | Otsubo et al. | |
| 2015/0206957 A1 | 7/2015 | Facchetti et al. | |
| 2016/0064545 A1* | 3/2016 | Pillarisetty | H01L 21/845 257/365 |

OTHER PUBLICATIONS

Written Opinion for application No. PCT/EP2015/074264 dated Apr. 20, 2016.

\* cited by examiner

| Polymeric Dielectric | Repeat Unit | Optical Gap [eV] | Relative Permittivity (at 1kHz) |
|---|---|---|---|
| CYTOP™ |  | >6 | 2.1 |
| PαMS |  | 5.09 | 2.5 |
| PC |  | 4.98 | 3.2 |
| SAN |  | 5.37 | 3.4 |
| PMMA |  | 4.92 | 3.5 |
| FRFT |  | >6 | 40 |

ORGANIC POLYMER GATE DIELECTRIC MATERIAL FOR TRANSISTOR DEVICES

CROSS REFERENCE TO RELATED APPLICATIONS

This application is a National Stage of International Application No. PCT/EP2015/074264, filed on Oct. 20, 2015, which claims priority from United Kingdom Patent Application No. 1418610.0, filed on Oct. 20, 2014, the contents of all of which are incorporated herein by reference in their entirety.

The work leading to this invention has received funding from the European Community's Seventh Framework Programme (FP7/2007-2013) under grant agreement number NMP3-SL-2011-263042.

The present invention relates to thin film transistor (TFT) devices comprising inorganic metal-oxide semiconductors (MOXs).

To realize high performance MOX TFTs with good operational stability the metal-oxide community has mainly been focused on the combination of metal oxide semiconductors with inorganic gate dielectrics, such as $SiO_2$, $Si_3N_4$, $AlO_x$, $ZrO_x$, and $HfO_x$, which are the established gate dielectric materials for widely used inorganic semiconductors, such as amorphous or polycrystalline silicon.

The inventors for the present application have carried out extensive studies on the combination of inorganic metal oxides with interfacing organic, polymer gate dielectrics (PGD), and to their surprise have been successful in producing transistor devices exhibiting excellent operational stress stability and/or low operation voltages. In relation to electrical stability, it is noted that it had been thought that high stability oxide TFTs need to be interfaced with inorganic gate dielectrics, primarily $AlO_x$, $SiO_x$, and $SiN_x$, which are more compatible with inorganic metal oxides in terms of atomic interface structure, mechanical and thermal properties.

In relation to low voltage operation, which is desirable for many low power applications, it is noted that it had been thought challenging to achieve low voltage operation without significant gate leakage currents, in view of the large band gap of MOXS (>3 eV), and the observed inverse correlation in inorganic oxides between relative permittivity and bandgap. It is noted here that the current understanding is that minimum energy offsets between the conduction/valence bands of the semiconductor and the gate dielectric of >1-2 eV are needed to confine the charge carriers at the active interface and minimize undesirable charge injection from the semiconductor into the gate dielectric.

There is hereby provided a transistor device comprising an inorganic oxide semiconductor channel having a channel length L and a channel width W between source and drain conductors and capacitively coupled to a gate conductor via an organic polymer dielectric in contact with the inorganic oxide semiconductor channel, wherein the gate voltage required to maintain a constant current of at least X nA between the source and drain conductors over a period of 14 hours while the gate and drain conductors are maintained at the same electric potential, varies by less than 1V, preferably less than about 0.2V; wherein X equals the W/L ratio multiplied by 50.

In one embodiment, said inorganic oxide semiconductor channel is an amorphous inorganic oxide semiconductor.

In one embodiment, said amorphous inorganic oxide semiconductor comprises at least one of indium and zinc.

In one embodiment, said semiconductor channel is capacitively coupled to said gate conductor by a gate dielectric consisting solely of organic polymer dielectric material.

In one embodiment, the transistor device is a top-gate transistor device.

In one embodiment, the transistor device is supported by a flexible plastic support film as a substrate.

In one embodiment, the flexible plastic support film comprises poly(ethylene-2,6-naphthalate), poly(ethylene terephthalate), poly(ether ether ketone) or polyimide.

There is also hereby provided a method of producing a transistor device as described above, comprising forming deposits of said inorganic oxide semiconductor and said organic polymer dielectric by solution-based processing.

In one embodiment, the method comprises forming said deposit of said organic polymer dielectric by a process with a maximum processing temperature of less than 80° C.

There is also hereby provided a light-emitting device operable by controlling a current through a light-emissive material via a drive transistor comprising source and drive conductors connected in series with a power supply and said light-emissive material, wherein said drive transistor comprises an inorganic oxide semiconductor channel capacitively coupled to a gate conductor via an organic polymer dielectric in contact with the inorganic oxide semiconductor.

In one embodiment, the voltage at the gate conductor of the drive transistor is controlled by one or more switch transistors.

In one embodiment, said light-emissive material comprises an organic light-emissive material.

In one embodiment, the method comprises forming deposits of said inorganic oxide semiconductor and said organic polymer dielectric by solution-based processing.

There is also hereby provided a method of operating a light-emitting device as described above, comprising driving the light-emitting device at a brightness of at least 100 $Cd/m^2$.

There is also hereby provided a method of operating a light-emitting device as described above, comprising passing a current of at least X nA through the light-emissive material and drive transistor, wherein X equals the W/L ratio of the drive transistor multiplied by 50.

There is also hereby provided a transistor device comprising an inorganic oxide semiconductor between source and drain conductors and capacitively coupled to a gate conductor via an organic polymer dielectric in contact with the semiconductor and exhibiting a dielectric constant at 1 kHz of at least 5, preferably greater than about 40.

In one embodiment, said organic polymer dielectric is a ferroelectric or relaxor ferroelectric polymer.

In one embodiment, the inorganic oxide semiconductor exhibits a HOMO-LUMO bandgap of at least 3 eV.

There is also hereby provided a method of producing a transistor device as described above, comprising forming deposits of said inorganic oxide semiconductor and said organic polymer dielectric by solution-based processing.

There is also hereby provided a method of producing a transistor device, comprising forming a deposit of an oxide semiconductor channel material from a solution of a metal organic precursor, annealing the precursor film in the presence of water at a temperature between 150-350° C. and depositing an organic polymer gate dielectric on top of the oxide semiconductor channel.

In one embodiment, the method comprises depositing the organic polymer gate dielectric by a deposition process with a maximum processing temperature of less than 80° C.

In one embodiment, said metal organic precursor is a metal alkoxide or a metal nitrate dissolved in an alcohol or water solvent.

In one embodiment, said oxide semiconductor channel material comprises at least 10% of metal hydroxide species after deposition of the polymer gate dielectric.

There is also hereby provided an electronic device comprising at least two transistor devices: a first transistor device comprising an inorganic oxide semiconductor channel and a second transistor device comprising an organic polymer semiconductor channel; and wherein both the inorganic oxide semiconductor channel and the organic polymer semiconductor channel are capacitively coupled to respective gate conductors via a common organic polymer dielectric in contact with both the inorganic oxide semiconductor channel and the organic polymer semiconductor channel.

In one embodiment, the first transistor device is an n-type transistor device, and the second transistor device is a p-type transistor device.

In one embodiment, the inorganic oxide semiconductor channel is an amorphous inorganic oxide semiconductor channel.

In one embodiment, the amorphous inorganic oxide semiconductor comprises at least one of indium and zinc.

In one embodiment, the semiconductor channels are both capacitively coupled to said respective gate conductor by a common gate dielectric consisting solely of organic polymer dielectric material.

In one embodiment, the gate voltage required to maintain a constant current of at least X nA between the source and drain conductors of the first transistor device, under constant conditions over a period of 14 hours while the gate and drain conductors of the first transistor device are maintained at the same electric potential, varies by less than 1V, preferably less than about 0.2V; wherein X equals the W/L ratio multiplied by 50.

In one embodiment, both the first and second transistor devices are top-gate transistor devices.

In one embodiment, both the first and second transistor devices are supported on a flexible plastic support film.

In one embodiment, the flexible plastic support film comprises poly(ethylene-2,6-naphthalate), poly(ethylene terephthalate), poly(ether ether ketone) or polyimide.

There is also hereby provided a method of producing an electronic device as described above, comprising forming a patterned deposit of one of the inorganic oxide semiconductor channel and the organic polymer semiconductor channel by a selective removal process whilst protecting a deposit of the other of the inorganic oxide semiconductor channel and organic polymer semiconductor channel.

In one embodiment, said protecting comprises forming a metal deposit over said other of the inorganic oxide semiconductor channel and organic polymer semiconductor channel, and removing said metal deposit after patterning of said one of the inorganic oxide semiconductor channel and the organic polymer semiconductor channel.

There is also hereby provided a method of producing an electronic device as described above, comprising forming deposits of said inorganic oxide semiconductor, said organic polymer semiconductor channel, and said organic polymer dielectric by solution-based processing.

There is also hereby provided a transistor device comprising an inorganic oxide semiconductor channel capacitively coupled to a gate conductor via a ferroelectric polymer dielectric in contact with the inorganic oxide semiconductor channel.

In one embodiment, the ferroelectric polymer dielectric comprises a poly(vinylidene-fluoride).

There is also hereby provided a method comprising: forming a deposit of a precursor to an oxide semiconductor material; and annealing the precursor deposit, first in the presence of oxygen at a first temperature, and then in the absence of oxygen at a second temperature lower than the first temperature.

In one embodiment, the first temperature is in the range of 230 to 275° C., and the second temperature is in the range of 80 to 100° C.

According to one embodiment, the MOXS-PGD transistor device exhibits excellent device performance and operational stress stability comparable to that achievable with inorganic gate dielectrics in combination with MOXS.

According to one embodiment of the invention, the MOXS-PGD transistor device has an operating voltage below 5V.

According to a further embodiment of the present invention, the AMOXS-PGD n-type transistor device shares a common PGD layer with a p-type organic semiconductor transistor device to form integrated complementary circuits.

According to one embodiment, a method of producing such integrated complementary circuit comprises forming deposits all of the two semiconductors and the common gate dielectric by solution processing.

Embodiments of the invention are described in detail hereunder, by way of example only, with reference to the accompanying drawings, in which:—

Figure 20:
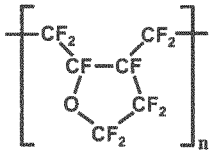
Figure 20:
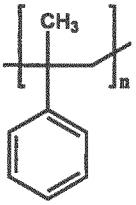
Figure 20:
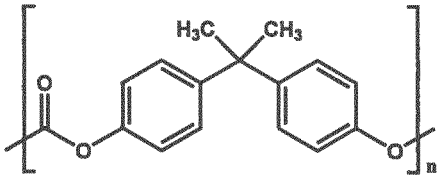
Figure 20:
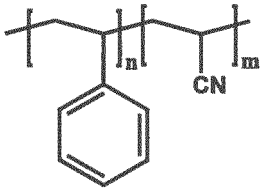
Figure 20:
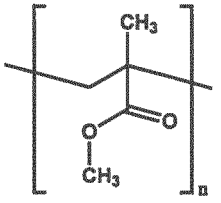
Figure 20:
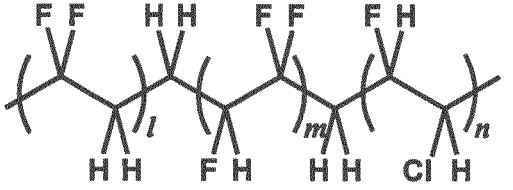
Figure 21:
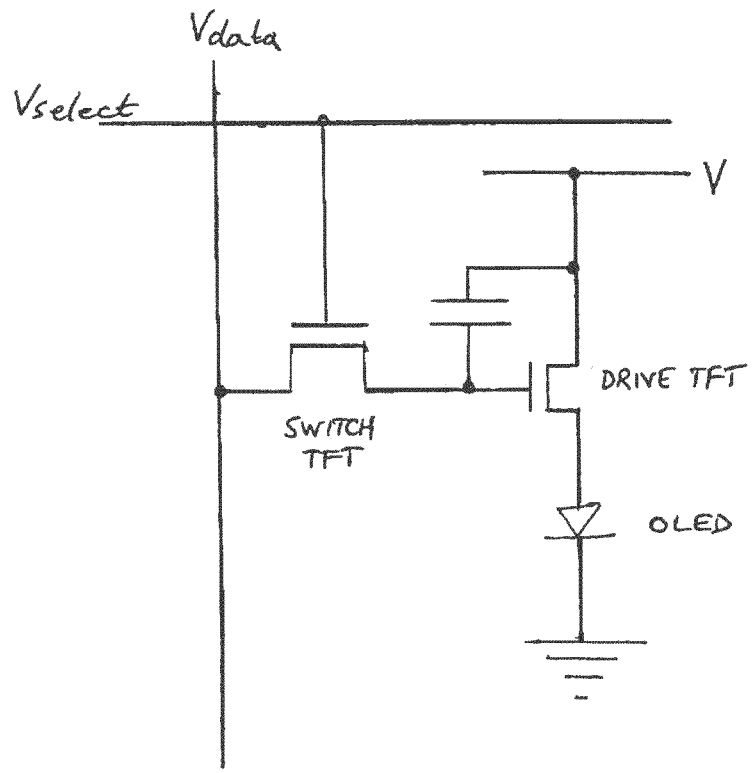
Figure 22:
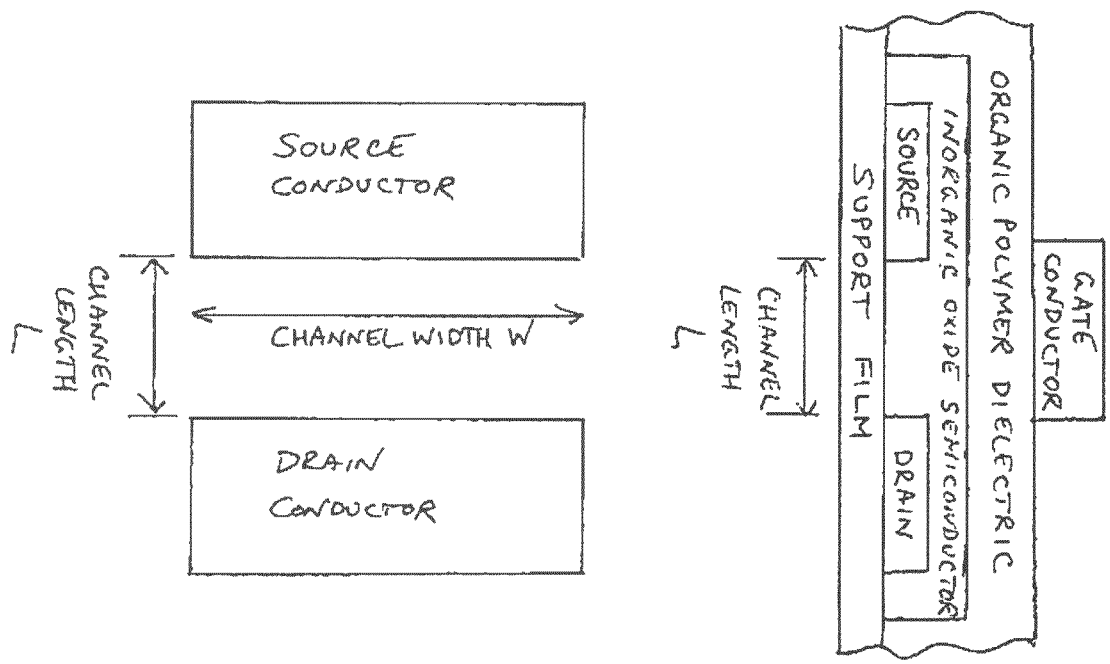

FIG. 20 indicates the optical gap and relative permittivity of different polymeric dielectrics used in embodiments of the present invention;

FIG. 21 illustrates an example of a light-emitting device drive circuit for which a transistor device according to an embodiment the present invention is useful; and FIG. 22 schematically illustrates some elements and dimensions of a transistor device.

Hereunder is described an examples of a method of producing TFT devices according to an embodiment of the invention. In this example, the TFTs were produced in the staggered top-gate geometry on Corning® 1737 slides, but the invention is equally applicable to other geometries including bottom-gate and/or planar and/or vertical geometries, and to TFTs supported on other support substrates such as plastic support films comprising e.g. poly(ethylene naphtalate), poly(ether ether ketone), poly(ethylene terephthalate) or polyimide. In fact, the production techniques described below facilitate the use of flexible plastic support films and the production of flexible electronic displays such as flexible displays.

The source and drain electrodes, consisting of thermally-evaporated gold (20 nm thick) on an ultra-thin chromium adhesion layer (1 nm thick), were patterned by conventional photolithography into an interdigitated structure having a channel length of L=10 μm and a channel width of W=1 mm. After source and drain deposition and patterning, the samples were coated with a film of a precursor to an amorphous metal oxide semiconductor, which film was then was subjected to the annealing step detailed in the following. The resulting amorphous metal-oxide film was then patterned via conventional wet etching in diluted hydrochloric acid, so as to substantially confine it to the regions between and over the source and drain electrodes. Subsequently, an organic polymeric dielectric was spun from a solution in a suitable organic solvent directly on the amorphous metal oxide. Finally, aluminium gate electrodes (40 nm thick) were thermally evaporated through a shadow mask to form gate electrodes directly above the transistor channel regions.

The solution-based amorphous metal-oxide semiconductor utilized in this example is an indium-zinc oxide (IZO), produced from a 8:2 blending ratio of alkoxide-based indium and zinc precursors, produced in thin-film form according to a 'sol-gel on chip' method (Banger, et al., Nature Materials 10, 45 (2011)).

Alternatively, films of MOXS were prepared from a solution of indium nitrate hydrate and zinc nitrate hexahydrate, so that $In_2O_3$:ZnO=6:4. A molar concentration of 0.15M was achieved by adding 10 ml of DI water. The solution was stirred overnight and it was found that it could be used for more than three months. In the case of indium-gallium-zinc oxide (IGZO), a gallium nitrate hydrate precursor was used.

To convert the precursor film into a metal oxide the precursor film was subjected to a two-hour-long annealing treatment in air at typically 230-275° C. UV illumination (at a wavelength of 254 nm and with a 5-8 mWcm$^{-2}$ irradiance) was used to improve device performance at low annealing temperatures. We also found surprisingly that the mobility performance could be enhanced and device hysteresis could be reduced by subjecting the film to a low-temperature anneal at 80-100° C. under anaerobic conditions, i.e. under $N_2$ atmosphere, for several hours after the high-temperature air anneal. This is believed to remove electron trapping species from the surface of the film that would otherwise act as electron traps.

In both cases the as-deposited MOXs films comprise a large concentration of metal hydroxide species (>10-30%). Some of the residual hydrogen is believed to act as a shallow n-type dopant and passivate or compensate defect states that would otherwise act as electron traps, thereby benefiting device performance.

Figure 1:
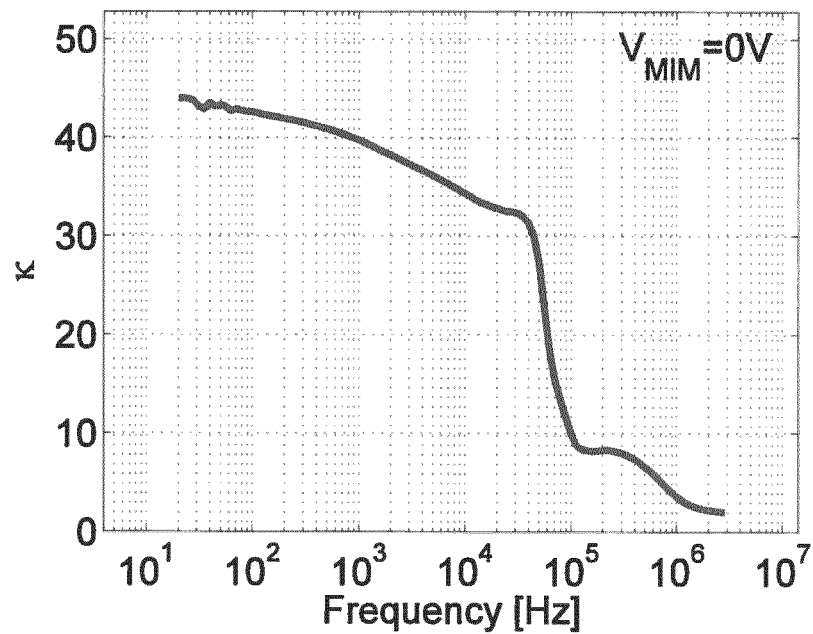
FIG. 1 shows the relative permittivity versus frequency of a gate dielectric material used in one embodiment of the present invention.

The polymer dielectric materials used for the gate dielectric are shown by their repeat units in FIG. 1: CYTOP™, an amorphous fluoropolymer of the PTFE family; poly(α-methylstyrene) (PαMS), a hydrophobic polymer with a phenyl functionality; poly(styrene-co-acrylonitrile) (SAN), a copolymer with nitrile functionality; poly(bisphenol A carbonate) (PC), a stiff thermoplastic with outstanding thermal stability; poly(methyl methacrylate) (PMMA), a ubiquitous polyacrylate with excellent optical transparency; P(VDF-TrFE-CFE), a fluorinated relaxor ferroelectric terpolymer, referred to as FRFT in the following. CYTOP™ was purchased from Asahi Glass Co. Ltd., PαMS from Polymer Source Inc., SAN and PC from Scientific Polymer Inc., PMMA from Sigma-Aldrich®, and the FRFT from Piezotech SAS. Except CYTOP™, which was received in solution, all the other polymers came in the form of pellets or powder and were dissolved in suitable anhydrous organic solvents. The polymers were all deposited by spin coating in a nitrogen glovebox with ppm levels of both oxygen and water. Their resulting thickness was in the region of 100-200 nm, except for the CYTOP™ films, for which the thickness was 330 nm. The films were all subjected to thermal curing (i.e., drying) at 80° C.

The current-voltage characterization of our transistors was performed at room temperature in a nitrogen-atmosphere glovebox (with oxygen concentration below 2 ppm at all times) utilizing an HP4155C SPA (Agilent Technologies). The reported transistor mobility was calculated from the linear transfer characteristics as $$\mu = \left(V_{DS} C_I \frac{W}{L}\right)^{-1} \left(\frac{\partial I_{DS}}{\partial V_{GS}}\right),$$

where $C_I$ is the gate dielectric capacitance per unit area.

Impedance analysis was used to characterize the relative permittivity of the polymeric dielectrics, from which was derived the field-effect capacitance of the TFTs. Metal-insulator-metal (MIM) structures were produced for this purpose, the impedance of which was measured with an HP4192A impedance analyzer (Agilent Technologies). MIM structures with different areas were utilized (the MIM structures had round electrodes with radius equal to 250 μm, 500

μm, 1000 μm), so that the slope of the linear interpolant of the capacitance-area dataset would give the parasitic-free capacitance per unit area. The latter value was then multiplied by the film thickness to determine the dielectric permittivity.

Ultraviolet-visible absorbance of thin films of the polymer gate dielectric materials used in the TFTs of this embodiment was measured in air through an HP845x spectrometer. For these measurements, the thin films were deposited on Spectrosil® 2000 substrates, given their extremely low cut-off wavelength of about 200 nm. Bare substrates (i.e. the same substrates without any polymer gate dielectric material deposited thereon) were used as the baseline for all spectra.

As a preliminary evaluation of the suitability of the selected polymeric insulators as gate dielectrics for IZO-based TFTs, their energy gaps were assessed by means of UV-vis transmission spectrometry. In fact, for an insulator to allow the charge confinement required for transistor performance, it is crucial that its energy band offsets with respect to the semiconductor are sufficiently large, and greater than approximately 1 eV[24]. Were this not the case, charge would be injected into the dielectric at small or moderate electric fields, causing a reduction in accumulated charge at the interface, an increase in gate current, and a deterioration of device stability. While this requirement is easily met by a great number of polymeric insulators with respect to a variety of semiconductors (e.g., organic semiconductors), the very large bandgap of AMOXSs (e.g., 3 eV for our IZO) makes it considerably more restrictive. Indeed, for charge confinement to be achieved in combination with an AMOXS, the gate dielectric should have a bandgap of at least 5 eV, with this lower limit corresponding to the best-case scenario in which the frontier energy bands of the dielectric are symmetrically located around the ones of the semiconductor.

A particularly preferred class of PGD in one embodiment of the present invention are high-k relaxor ferroelectric polymers of the poly(vinylidene-fluoride) (PVDF) family that realize relative permittivities as high as 50 utilizing the strong dipoles of ferroelectric PVDF but retain large bandgap>5-6 eV. In contrast to the ferroelectric homopolymer, they achieve a quasi-linear polarization (in the so-called relaxor ferroelectric fashion) by means of defect-induced interruption of the ferroelectric domains (Chen et al., Relaxor Ferroelectric Polymers-Fundamentals and Applications. Ferroelectrics, 354(1):178-191, August 2007).

The optical gaps of the polymer gate dielectric materials used in the examples are given in the table of FIG. 20, as extracted from their UV-vis absorbance. Both the fluorinated polymers do not show appreciable absorption in the measured range, thus indicating an optical gap greater than 6 eV. All polymer gate dielectric materials exhibit an optical gap considerably greater than the 3 ev bandgap of IZO, which is consistent with the excellent low gate leakage currents and excellent stability measured for the TFTs, as discussed below. It is thought to be preferable that the energy band offsets of the polymer gate dielectric with respect to the AMOXS (i.e. the difference between the HOMO energies of the semiconductor and gate dielectric, and also the difference between the LUMO energies of the semiconductor and gate dielectric) are greater than about 1 eV, in order to avoid significant injection of charge carriers into the dielectric at small or moderate electric fields, and thereby avoid a reduction in accumulated charge at the interface, an increase in gate current, and a deterioration of device stability.

Figure 2:
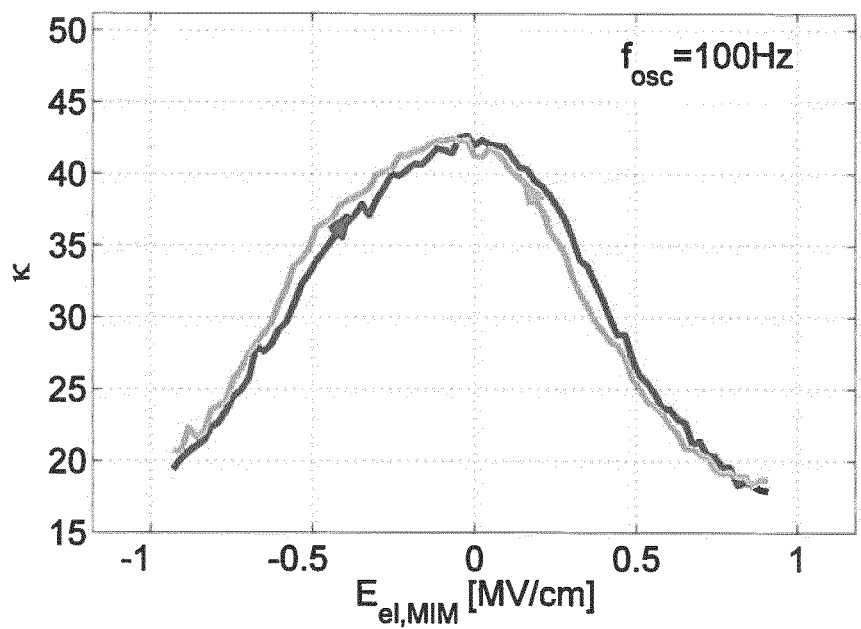
FIG. 2 shows the relative permittivity versus electric field of a gate dielectric polymer used in one embodiment of the present invention.

The dielectric response of the selected polymers was characterized with an impedance analyzer, using thin-film MIM structures (polymer film thickness≈200 nm). The extracted relative permittivities are listed in the table of FIG. 20. The dielectric response is constant within the instrumental frequency range (up to 1 MHz) for all the low-κ materials, making them ideal candidates for stable and high-speed AMOXS-based TFTs (given the absence of slow polarization effects). The FRFT exhibits a very large relative permittivity at 1 kHz, but as discussed below, the TFT including this polymer gate dielectric on AMOXS was surprisingly found to nevertheless exhibit a low gate leakage current and excellent stability. However, as shown in FIGS. 1 and 2, this polymer gate dielectric material manifests a pronounced relaxation at frequencies higher than 40 kHz, and an appreciable field dependence beyond 400 kVcm$^{-1}$. As a consequence, this latter polymeric dielectric best lends itself to AMOXS TFTs requiring low-voltage transistor operation at relatively low operational speeds.

Another important characteristics of PGD for top-gate MOX TFT fabrication is the low process temperature (<100° C.) that can be used for the PGD. As stated above the as-deposited MOXs films comprise a large concentration of metal hydroxide species (>10-30%) that can be detected in X-ray photoemission spectroscopy (XPS). Some of the residual hydrogen is believed to act as a shallow n-type dopant and passivate or compensate defect states that would otherwise act as electron traps. To retain some of the beneficial hydrogen on the surface of the MOX at which the active interface of the top-gate TFT is formed, a low process temperature is preferred to prevent escape of hydrogen from the surface layer. A PGD processed at low temperature and not involving the formation of covalent bonds at the interface retains a sufficient hydrogen concentration on the surface of MOXs so that not only a high mobility but also a high operational stress stability can be achieved (see below).

Figure 3:
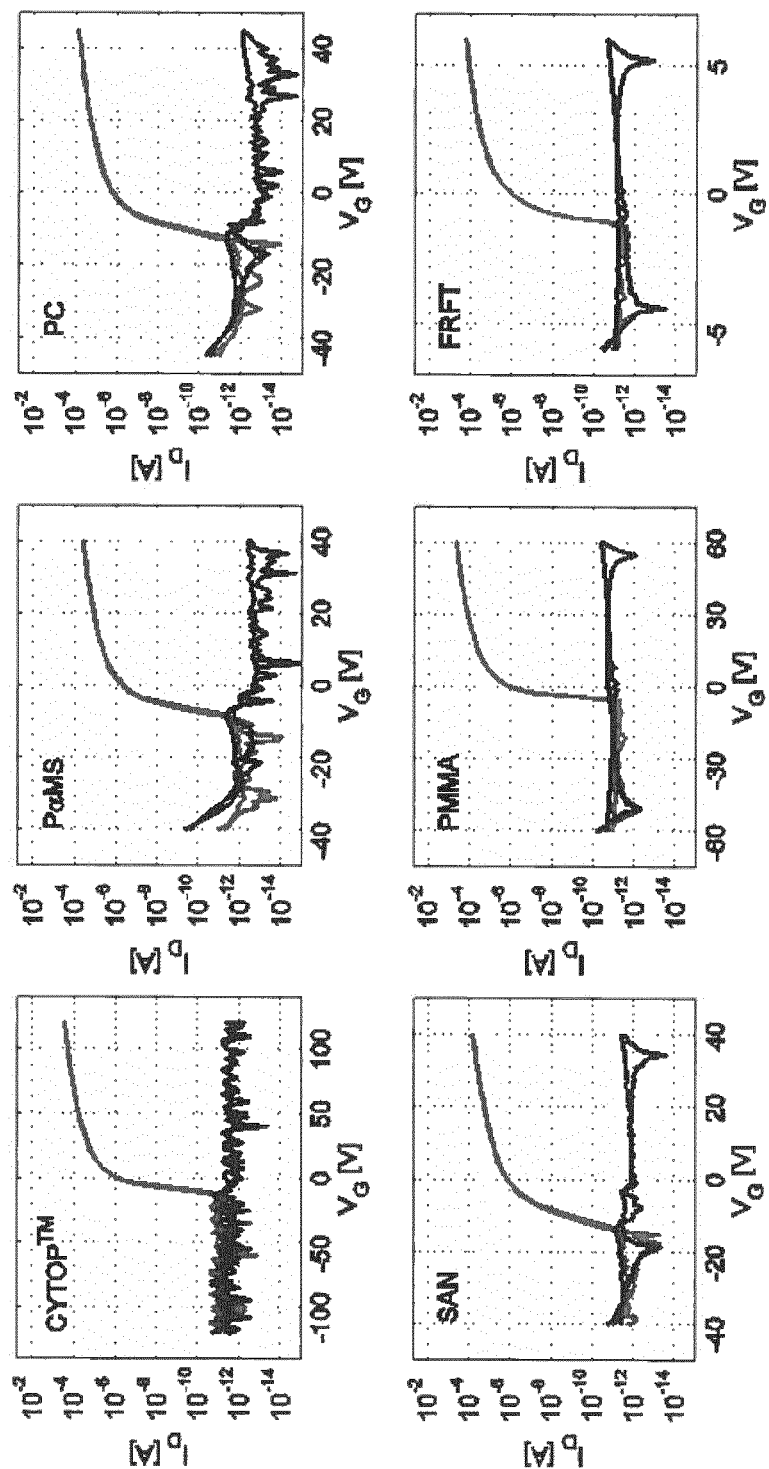
FIG. 3 shows the linear transfer characteristics of solution-based TFTs according to embodiments of the invention.

FIG. 3 shows representative linear transfer characteristics for each of the TFTs with different polymer gate dielectrics, acquired for a symmetric double gate voltage sweep applied in continuous mode. The TFTs were all operated in the linear region with $V_{DS}$=1V. Hysteresis-free transistor behaviour was observed for all the tested devices, with on/off ratios at the same level ($10^8$) as those reported for IZO devices utilizing $SiO_2$ as gate dielectric. The maximum gate voltage applied to all TFTs was such that the devices were subjected to a maximum gate field in the region of 4 MVcm$^{-1}$, with the only exception being the FRFT TFTs, for which much lower gate fields were applied to achieve equivalent current levels. In all samples the gate current in electron accumulation was close to the detection limit of the instrumentation used, denoting a gate leakage below 10 nAcm$^{-2}$, the latter value being reached at the maximum applied field. For negative gate voltages the situation was the same, except for the PαMS and PC TFTs, which were characterized by a slight increase in gate current (also reflected in the source and drain current) beyond E>2 MVcm$^{-1}$. This low leakage current is particularly surprising for the high k FRFT, in view of the relatively high leakage currents observed for high k inorganic gate dielectrics such as $ZrO_x$ and $HfO_x$ in combination with MOX semiconductors.

Figure 4:
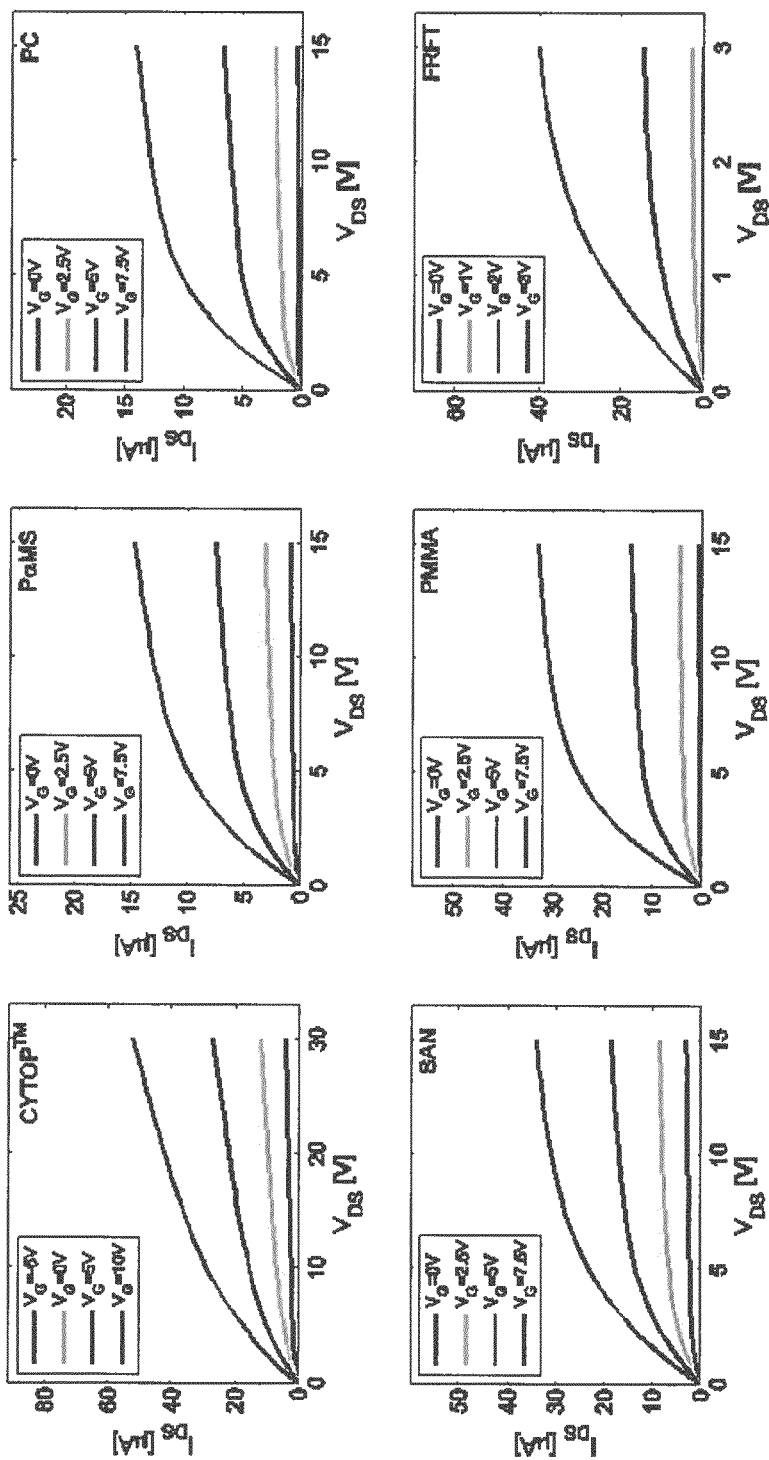
FIG. 4 shows the output characteristics of solution-based TFTs according to embodiments of the invention.

FIG. 4 shows the measured output characteristics for all the TFTs. The Vg for each line is indicated in the information boxes in the order opposite to how the lines are arranged, e.g. the Vg for the line at the bottom is indicated at the top of the information box, and so on. They all exhibit a linear behaviour close to the origin of the $I_D$-$V_D$ plane, indicating negligible contact resistance. It is noted that the TFT with the FRFT gate dielectric achieves low-voltage transistor operation (within a voltage range as small as 2-3V).

Figure 5:
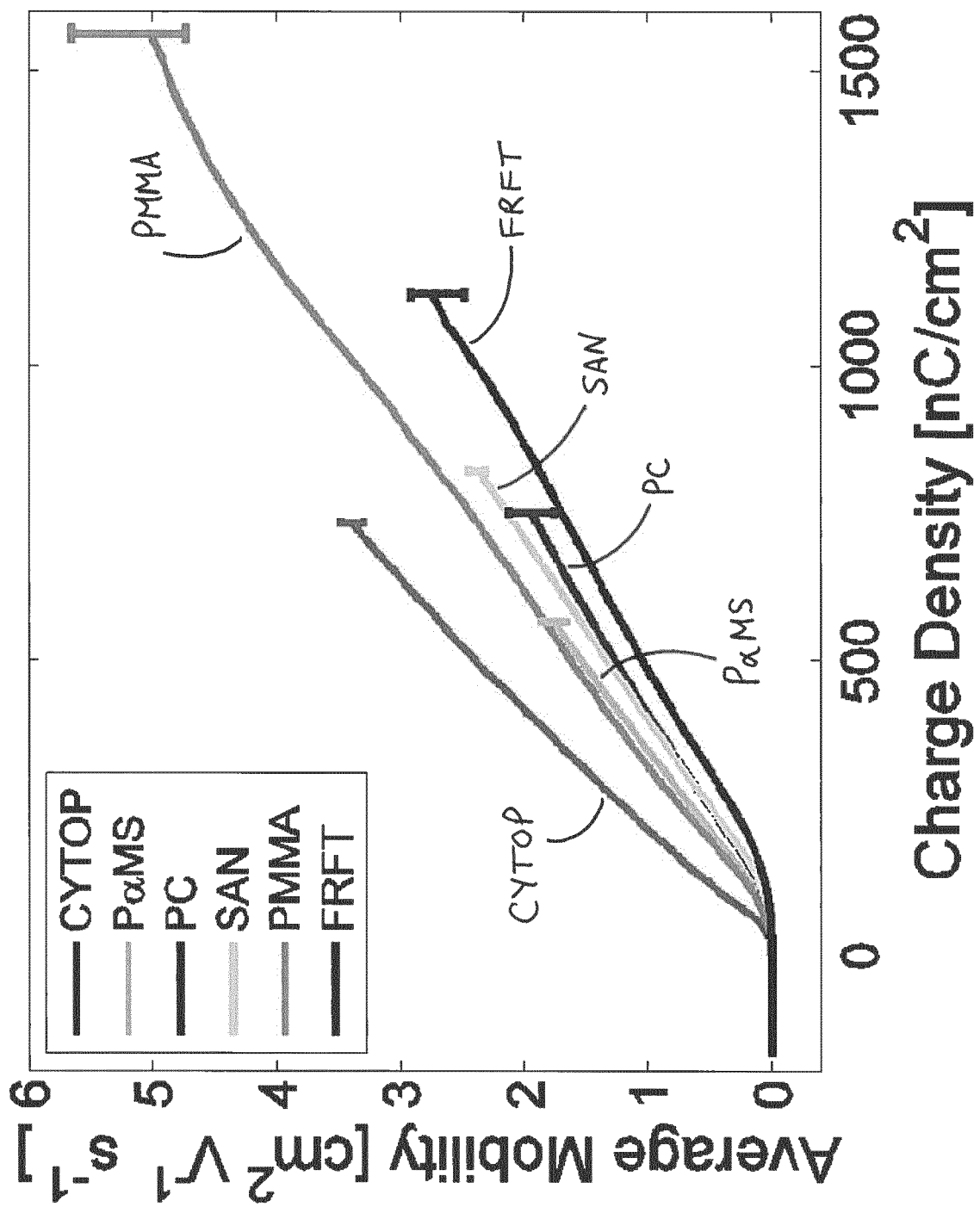
FIG. 5 shows the average linear mobility versus charge density of TFT devices according to embodiments of the present invention.

We extracted the linear field effect mobility of a number of TFTs comprising each of the selected polymeric dielectrics in combination with our IZO. Given the differences in permittivity and thickness of the polymer gate dielectric between the different TFTs, the mobility was plotted against charge density and is shown in FIG. 5. The induced charge density was estimated as $Q_{ind}=C_I(V_{GS}-V_{ON})$, where $V_{ON}$ is the transistor onset voltage. FIG. 5 shows the average linear mobility versus charge density as extracted from the measured transfer characteristics of about 10 samples of each kind of TFT having the same polymer gate dielectric. The average mobility is the arithmetic average of the mobility over all samples of each kind of TFT, and the error bars indicated the spread at the maximum supplied carrier charge density. FIG. 5 shows that the mobility varies roughly linearly with $Q_{ind}$; although a saturation effect may occur at high charge densities, as suggested by the change in slope of the PMMA trace. Mobility values in the range of 2-6 $cm^2V^{-1}s^{-1}$ are extracted from all TFTs, comparable with the ones obtained for the same AMOX semiconductor in bottom-gate devices with thermal $SiO_2$ as gate dielectric. It is noted that the CYTOP™ TFTs (with κ=2.1) give a significantly higher mobility than the ones using FRFT (κ=40), while the samples with intermediate permittivities result in intermediate mobility values. The dependence of the mobility on the permittivity, however, is rather weak compared to what has been observed for organic semiconductors, the other major class of semiconductors in the same mobility range as AMOXSs. In fact, for both semiconducting polymers and organic crystalline molecular films, the mobility changes by orders of magnitude with the relative permittivity of the gate dielectric. In this latter class of materials the effect was found to derive from the coupling between the charge carriers and the polar environment dictated by the gate dielectric, which is strong given the very high effective mass of the charge carriers in organic semiconductors. The weak dependence of the mobility on relative permittivity we observe in our hybrid AMOXS-based TFTs suggests that such interaction is much weaker for electrons in IZO.

The sub-threshold slope extracted from the linear transfer characteristics of the hybrid TFTs manifests an inverse dependence on the relative permittivity of the gate dielectric, with the CYTOP™ TFTs giving the highest values (≅2V $dec^{-1}$) and the FRFT TFTs the lowest (≤100 mV $dec^{-1}$, nearly an order of magnitude lower than the other TFTs, and quite close to the theoretical limit at room temperature). We used these values to estimate the trap state density at the semiconductor-dielectric interface, through the equation $$S = \frac{kT}{q}\log(10)\left(1 + \frac{q^2}{C_I}N_{eff}\right).$$

Figure 6:
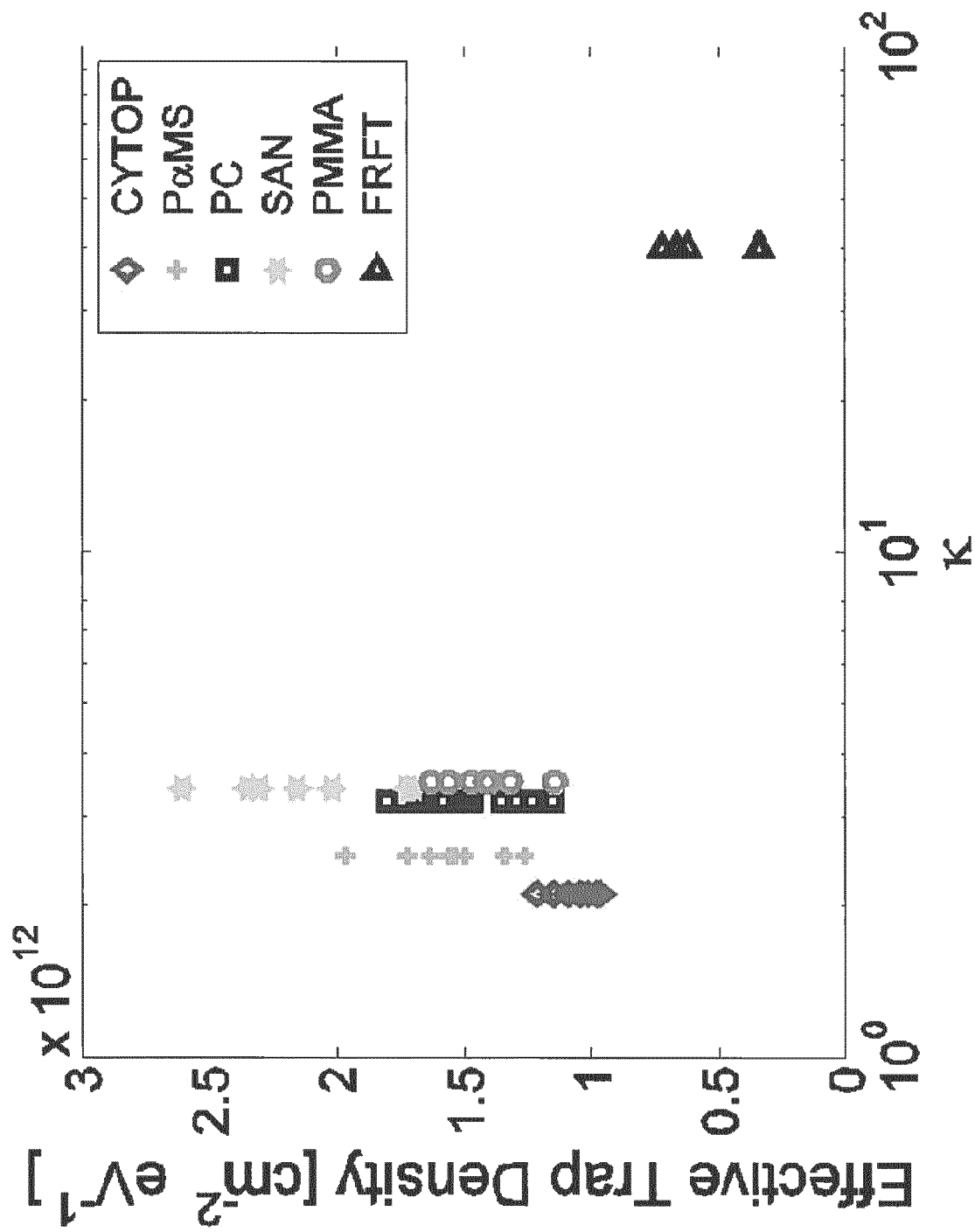
FIG. 6 shows the effective trap density versus permittivity for TFT devices according to embodiments of the invention.

FIG. 6 shows the estimated effective trap density versus permittivity for each kind of TFT. The estimated densities are in the region of $10^{12}$ $cm^{-2}$ $eV^{-1}$, except for the FRFT TFTs, which yield significantly lower values. From this we gather that the decreasing trend observed in the sub-threshold slope is primarily determined by the stronger gate-to-channel capacitive coupling allowed by gate dielectrics with higher permittivity. The low sub-threshold slope and reduced trap density make the IZO-FRFT combination an ideal one for low-voltage TFTs.

The extracted trap densities are perfectly aligned with the values for bottom-gate TFTs with sputtered and solution-processed AMOXSs and employing inorganic gate dielectrics. When compared with the top-gate AMOXS TFTs, a distinction must be made on the basis of the deposition technique employed for the gate dielectric. Indeed, the above-described TFTs according to an embodiment of the present invention show trap densities matching the values of top-gate devices with gate dielectrics deposited by ALD and PECVD, but are superior to the ones fabricated with sputtered dielectrics.

As discussed below, the above-described TFTs according to an embodiment of the present invention were surprisingly found to exhibit excellent stability under constant-current bias-stress experiments. Such stability makes these TFTs suitable as drive TFTs in drive circuits for active matrix organic light-emitting diode (OLED) displays, particularly ones driven at relatively high brightnesses>100 Cd/m2, and/or operated at relatively high drive currents (greater than (50×W/L) nA) through the drive TFT and OLED. One example of a drive circuit for one pixel of a OLED display is shown in FIG. 21. The drive TFT is connected in series with the power supply V and the OLED, and in this example the gate voltage of the drive TFT is itself controlled by a switch TFT whose output depends on the voltages Vdata and Vselect applied to the source and gate electrodes of the switch TFT.

Constant-current bias-stress experiments were performed on all the above-described TFTs with the different polymeric dielectrics. In these stress experiments, the TFTs were subjected to a constant current of 0.5 µA between the source and drain conductors. This constant current corresponds to 250 nA at W/L=5 (wherein W/L is the ratio of the TFT channel width to the TFT channel length), which is currently considered to be the minimum performance requirement for drive TFTs for AMOLED displays today. Gate and drain electrodes were shorted throughout the duration of the stress, which was interrupted only for the measurement of the transistor transfer characteristics at logarithmically spaced times.

Figure 7:
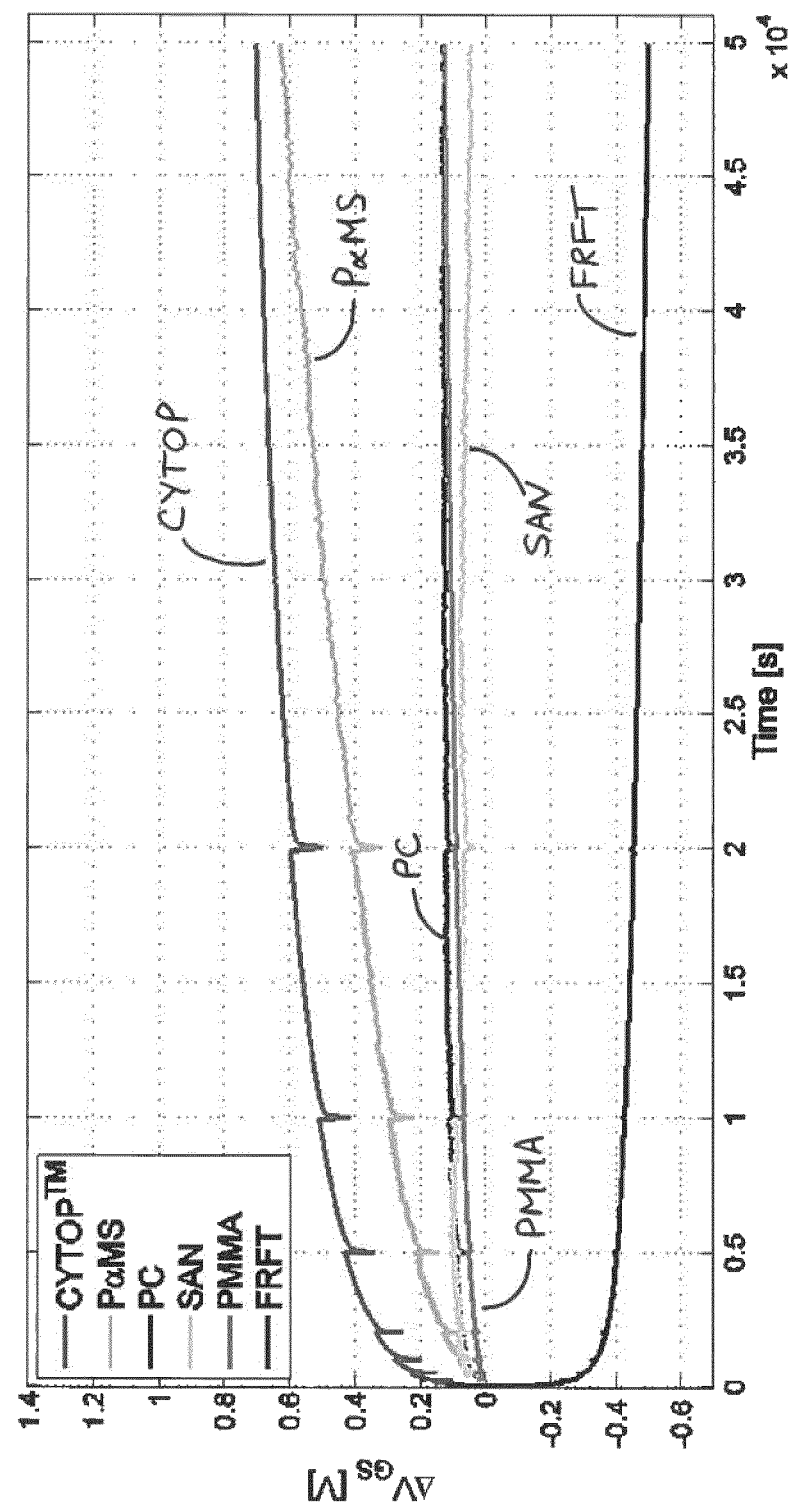
FIG. 7 shows the gate-voltage shifts during constant-current stress experiments on TFTs according to the embodiments of the inventions.

FIG. 7 shows the shift in gate voltage necessary to maintain the current between the source and drain electrodes of the TFT constant over a stress time of 14 h. The spikes present in each trace are due to the transient charging of the channel after measuring the transfer characteristics. Two kinds of behaviour were observed: on one hand, the TFTs with the FRFT dielectric undergo a negative gate voltage shift; on the other, the rest of the TFTs exhibit a positive gate-voltage shift. The overall shifts are extremely small, especially considering the sizeable stress time: in the TFTs with low-κ dielectrics $\Delta V_G$≤0.7V, and in the PC, SAN and PMMA ones the shift is as low as 0.1V; the FRFT sample, instead, gives $\Delta V_G$=−0.5V.

Figure 8:
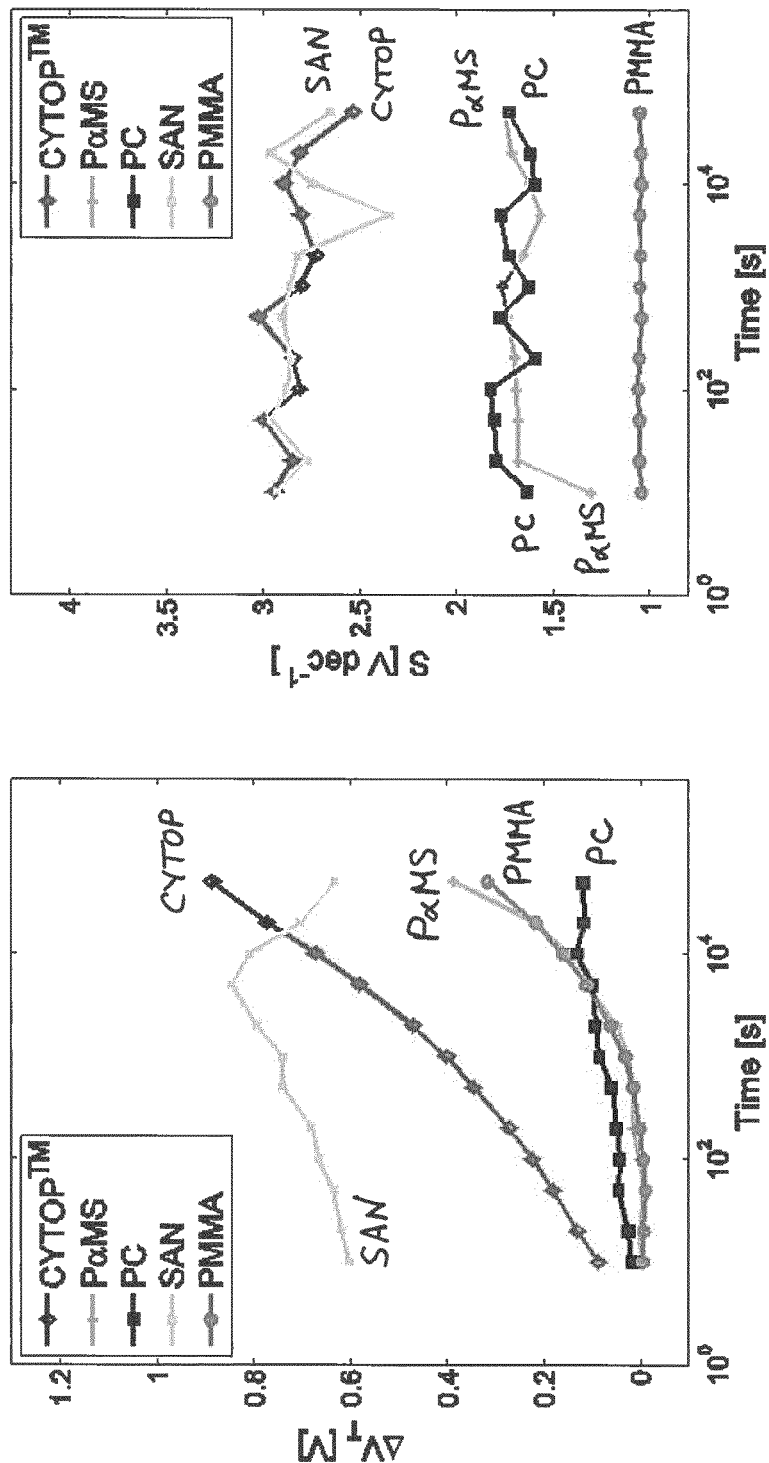
FIG. 8 shows the threshold-voltage shift and sub-threshold slope of TFTs according to the present invention during constant-current stress experiments.

In the TFTs with low-κ dielectrics, all of them give a matching shift of onset and threshold voltages, along with a constant subthreshold slope (see FIG. 8). Moreover, mobility as a function of gate voltage is rigidly shifted in the direction of the applied bias. We note that the observed stability of the above-described hybrid solution-based TFTs according to an embodiment of the invention is on par with the one reported under equivalent stress conditions for state-of-the-art oxide devices produced by vacuum techniques.

The surprisingly high levels of stability in the above-described hybrid TFTs according to an embodiment of the present invention is attributed to the existence of 10-30 atomic % or more residual hydroxide species in the AMOXS film in the finally formed TFT, which arise from the alkoxide precursor method used to deposit the AMOXS films, and the low temperature (<80° C.) solution processing used to form the polymer gate dielectric on the AMOXS films.

The above-mentioned low interfacial trap density values, in the region of $10^{12}$ cm$^{-2}$ eV$^{-1}$, evidence that the selected polymeric dielectrics are inert with respect to the charge carriers in the oxide semiconductor. This fact is further confirmed by the suitable charge confinement provided by our range of polymeric dielectrics under electron accumulation, suggesting a conduction band offset in excess of 1 eV. Finally, the strength of the above-described transistors is testified by the above-mentioned electrical stability under stress, with the best semiconductor-dielectric combinations giving a threshold voltage shift as low as 0.1V after 14 h stress under demanding constant-current operating conditions.

Described below is an example of the use of a transistor device according to an embodiment of the invention in a complementary circuit.

Figure 9:
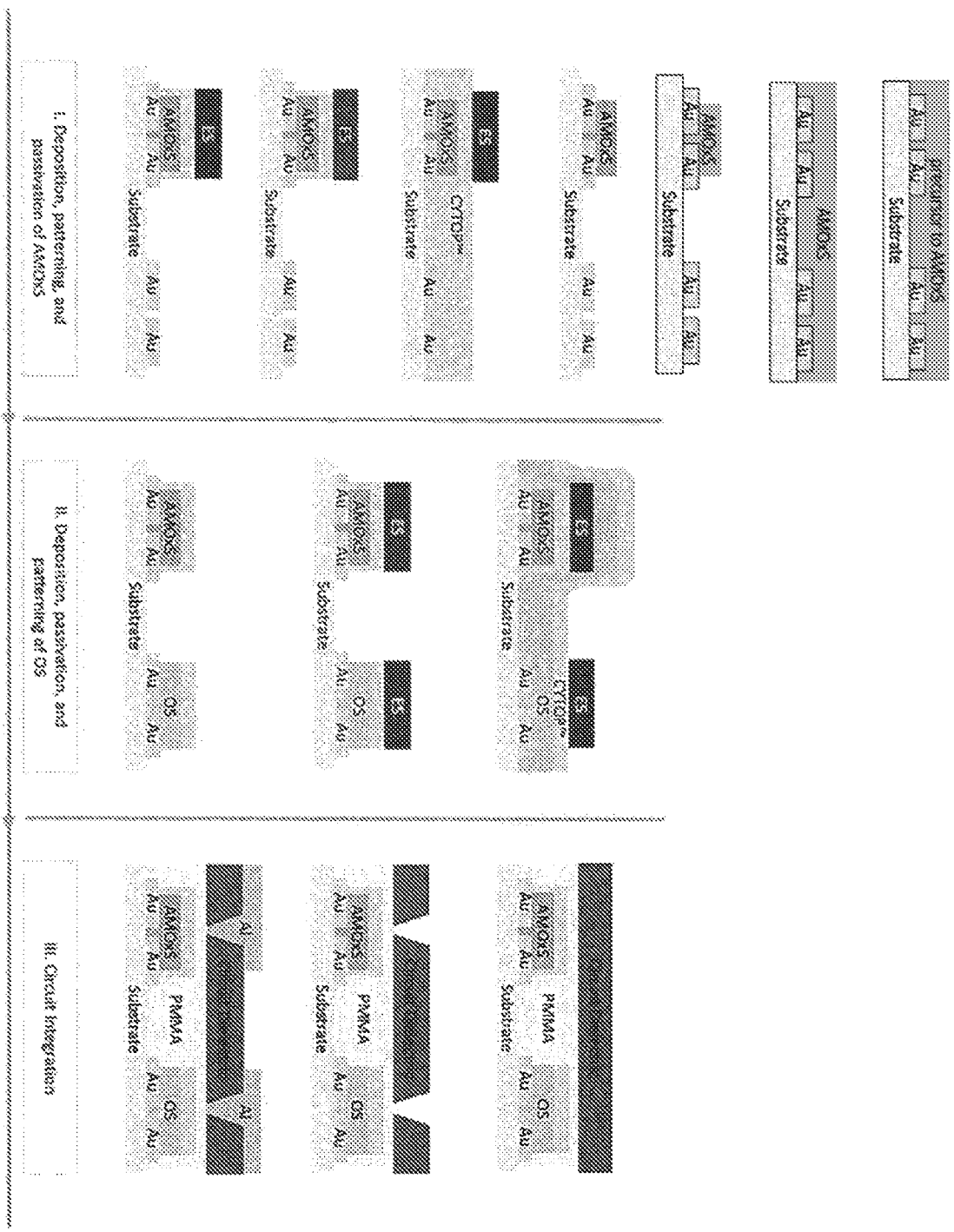
FIG. 9 shows an example of a method of producing an integrated circuit according to an embodiment of the invention.

A general illustration of a process flow according to one embodiment of the invention is shown in FIG. 9. The process flow allows the solution-based deposition of a p-type organic semiconductor (OS) and an n-type amorphous-metal-oxide (AMOxS), both processed by spin coating, patterned subtractively, and capped off with a shared polymeric gate dielectric.

The starting substrate consists of a glass slide on which thermally-evaporated gold source and drain electrodes are defined by photolithography (all patterned with a channel length of L=10 μm and a channel width of W=1 mm, unless stated otherwise). The amorphous metal-oxide semiconductor is deposited and patterned first, given its higher processing temperature and superior resistance to solvents, followed by the deposition and patterning of the organic semiconductor. Subsequently, a shared polymer gate dielectric is blanket coated on the sample, aluminium is thermally evaporated through a shadow mask to achieve self-aligned gate electrodes by the kind of process described in Nature nanotechnology 2(12) (2007) 784-9 (doi:10.1038/nnano.2007.365). Finally, circuit connectivity is realized on top of a circuit dielectric (photolithographically patterned S1813™, Shipley Microposit) by opening via holes through it by a combination of photolithography and oxygen-plasma ashing, and by depositing metal interconnects either by thermal evaporation, or from a commercial silver-based ink (TEC-U-050, InkTec Co., Ltd.) with a home-built single-nozzle printer.

Both semiconductors are blanket deposited by spin coating, and thus subtractive patterning is used to confine each of them to the active areas of their respective TFTs. The etching of the amorphous metal-oxide is achieved with diluted hydrochloric acid (by conventional lithography), whereas oxygen-plasma is used for the organic semiconductor. While etching the semiconductors, a suitable etch stopper (ES) is used to protect the active regions (semiconductor channels and source/drain electrodes) of the TFTs. Two different etch stoppers were used, one consisting of a photopatterned micron-thick S1813™ film, and another made of a 35 nm-thick thermally-evaporated aluminium film (patterned through a shadow mask). To avoid damaging the semiconductors during the etch-stopper deposition, a 100 nm-thick CYTOP™ (Asahi Glass Co., Ltd.) layer was employed, subsequently patterned by oxygen plasma. At the very end of the semiconductor patterning process, the protective S1813™/aluminium capping off the CYTOP™ islands was stripped by immersion in a suitable solvent (acetonitrile and Shipley's MF-319, respectively), so that the sample could undergo the further steps for circuit integration.

The semiconductors used in this example were: an indaceno-dithiophene-co-benzothiadiazole (IDTBT) conjugated co-polymer, a top performance p-type polymer which has been reported to give hole mobility up to about 2 cm$^2$V$^{-1}$s$^{-1}$ without requiring any high-temperature treatment; and a solution-processed alkoxide-based IZO, produced in thin-film form according to a 'sol-gel on chip'. In order to achieve balanced semiconductor mobilities in both semiconductors for optimum circuit speed, a process temperature of 250° C. was used annealing the IZO, so as to match the mobility of IDT-BT in the top-gate configuration.

Figure 11:
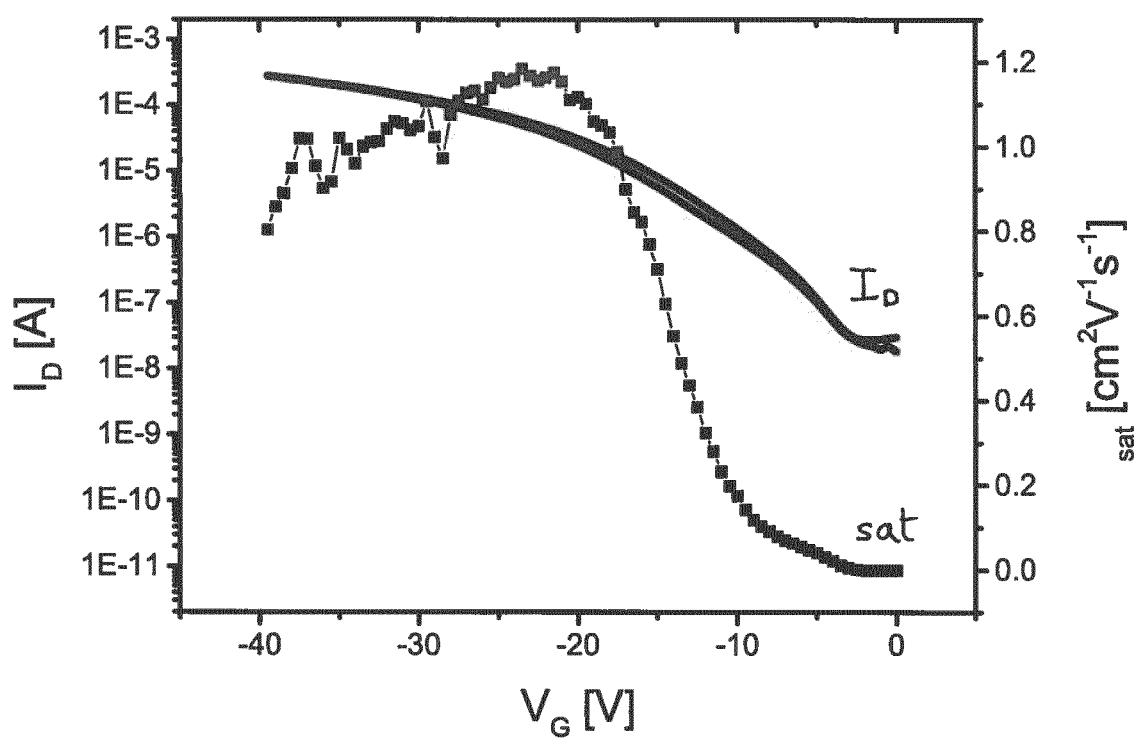
FIG. 11 shows the transfer characteristic and mobility of an IDT-BT TFT produced by a method according to an embodiment of the invention using a S1813™ etch stopper.
Figure 12:
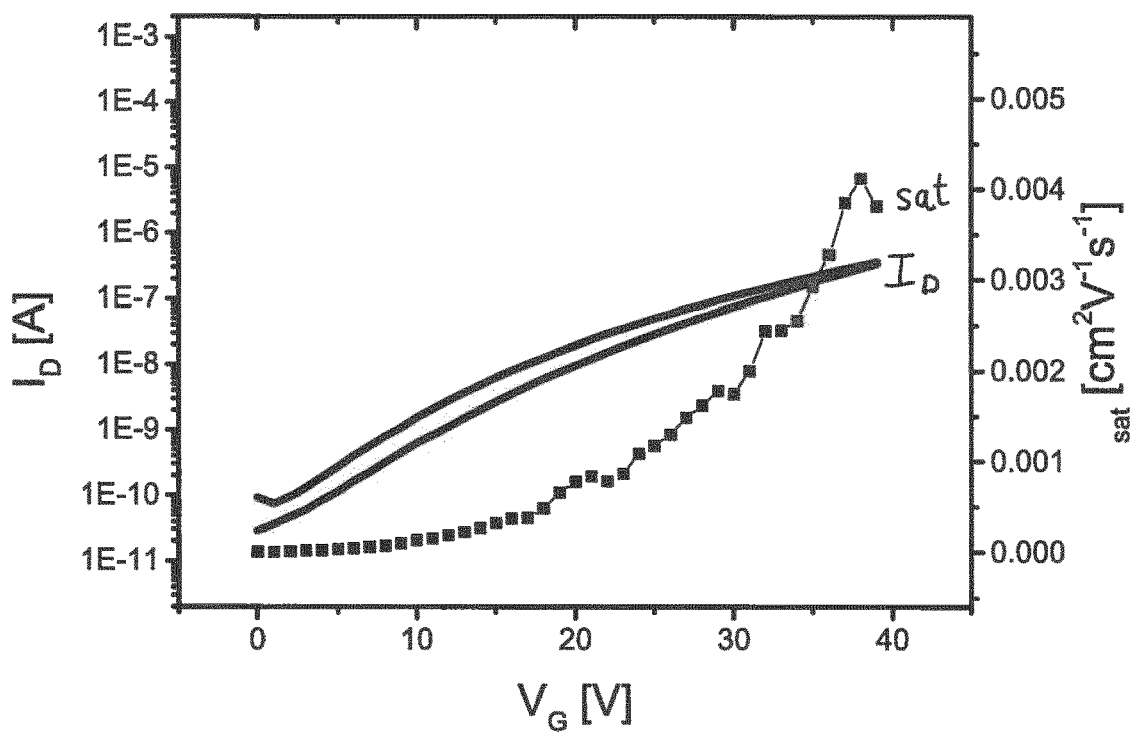
FIG. 12 shows the transfer characteristic and mobility of an IZO TFT produced by a method according to an embodiment of the invention the S1813™ etch stopper.
Figure 13:
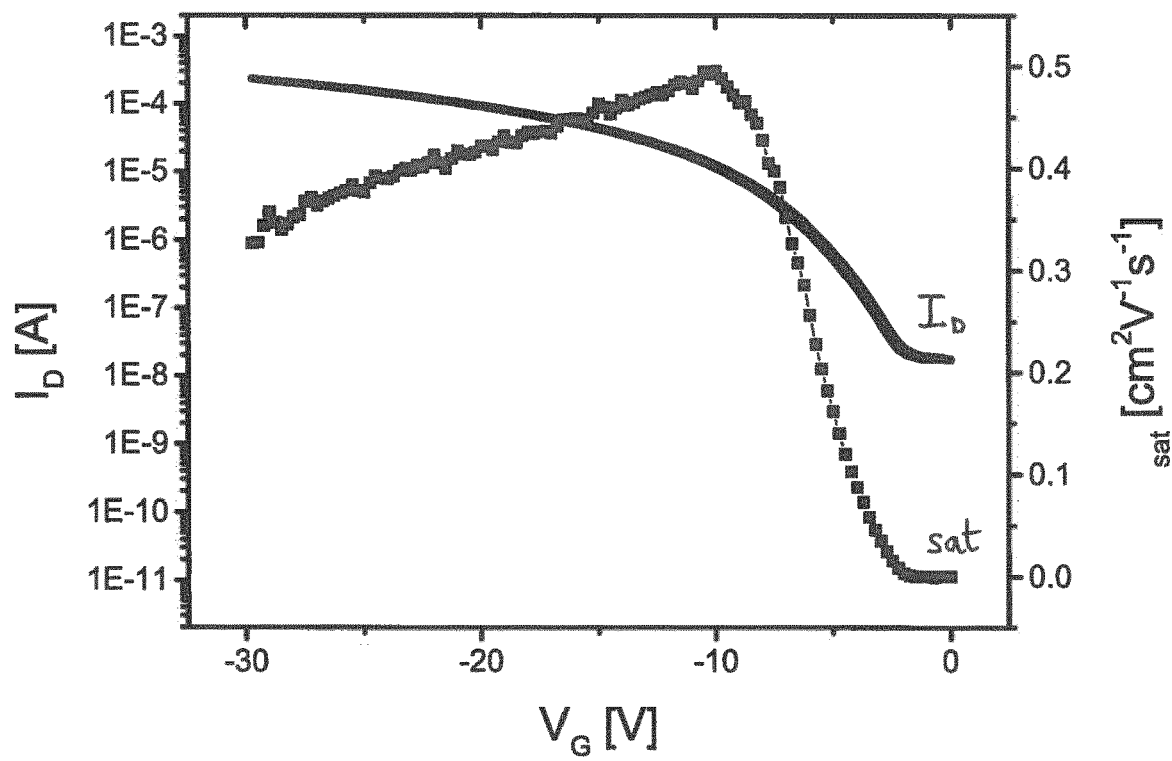
FIG. 13 shows the transfer characteristic and mobility of an IDT-BT TFT produced by a method according to an embodiment of the invention using an aluminium etch stopper.
Figure 14:
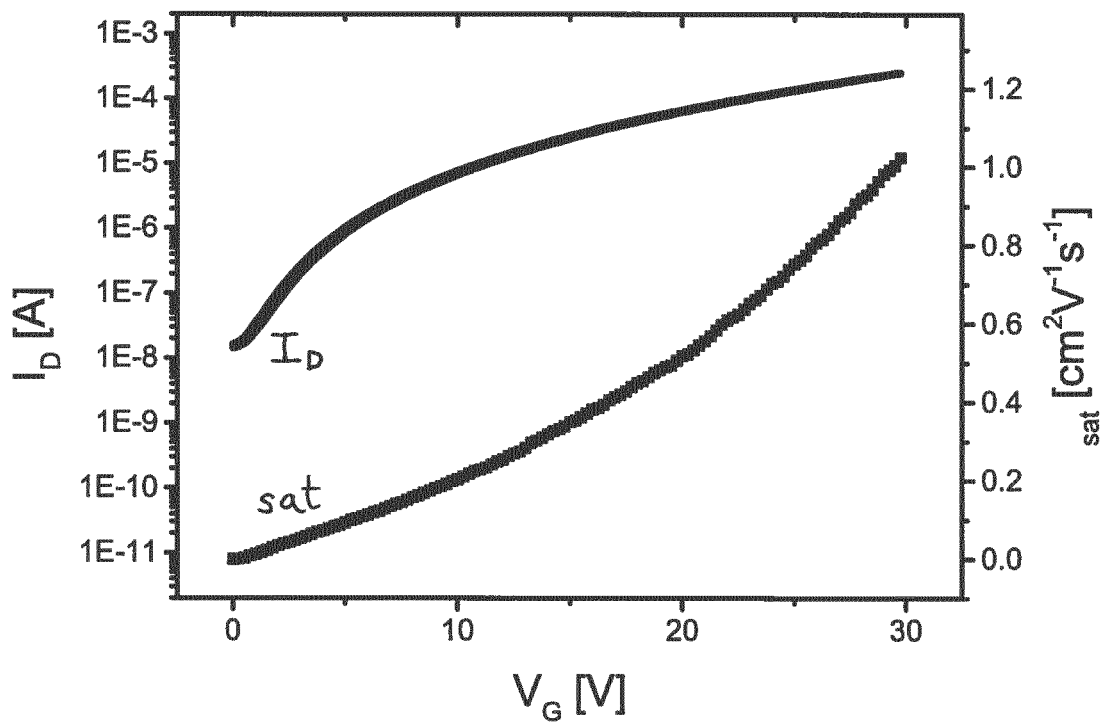
FIG. 14 shows the transfer characteristic and mobility of an IZO TFT produced by a method according to an embodiment of the invention using an aluminium etch stopper.

It was found that both etch-stoppers mentioned above were adequate in producing the desired device stacks. As for the electrical behaviour of the resulting TFTs, however, we observed less satisfactory performance with the S1813™ etch stopper. Transistor transfer characteristics for the two TFTs as measured for the case of using the S1813™ etch stopper are shown in FIG. 11 and FIG. 12. The organic TFTs perform as expected, whereas the metal-oxide ones give relatively low currents and mobilities, and exhibit large hysteresis. In contrast, in the case of using the aluminium etch stopper, both structural integrity and top-performance transistor behaviour was achieved. FIG. 13 and FIG. 14 show measured transfer curves for the n-type IZO TFT and the p-type IDT-BT TFT. Both semiconductors exhibit good mobilities, and the fact that the transfer curves are approximately mirror-images of each other suggests optimal operation for complementary logic. It is considered that the aluminium etch stopper is better provides better barrier properties with respect to the energetic oxygen-plasma species the sample is exposed to during the patterning steps.

It is noteworthy that the ultra-thin dielectric and organic semiconductor films allow very short oxygen-plasma etching cycles (7 min for a 300 W RF power). Moreover, the aluminium evaporation can be carried out in medium vacuum, as the sole purpose of the resulting films is to act as a barrier against oxygen plasma (e.g., in a system equipped with a 600 L/s diffusion pump, each evaporation cycle takes only 10 min). Therefore, the process utilizing the aluminium etch stopper allows complementary integration with minimal time overhead, and it is thus competitive with printing-based integration schemes. Finally, it is noted that the final integration process with the aluminium etch stopper is compatible with any polymeric gate dielectric, given that the sample is not exposed to any organic etchant throughout the process. The above-mentioned patterning process thus allows a great freedom in the selection of the gate dielectric, and, in particular, paves the way for the adoption of attractive high-κ alternatives for low-voltage operation. For the specific implementation discussed in the following, a bilayer gate dielectric comprising a 100 nm-thick CYTOP™ film topped with 180 nm-thick PMMA film was employed.

The current-voltage characterization of the TFTs and logic gates was performed at room temperature in a nitrogen-atmosphere glovebox (O2 below 2 ppm at all times) utilizing an HP4155C SPA (Agilent Technologies). The reported transistor mobility was calculated from the saturation transfer characteristics as $$\mu = \left(V_{DS}C_I\frac{W}{L}\right)^{-1}\left(\frac{\partial I_{DS}}{\partial V_{GS}}\right),$$

where $C_I$ is the gate dielectric capacitance per unit area. The time-domain characterization of the ring-oscillator circuits discussed below was carried out with a Tektronix oscilloscope (TDS2014B).

Figure 15:
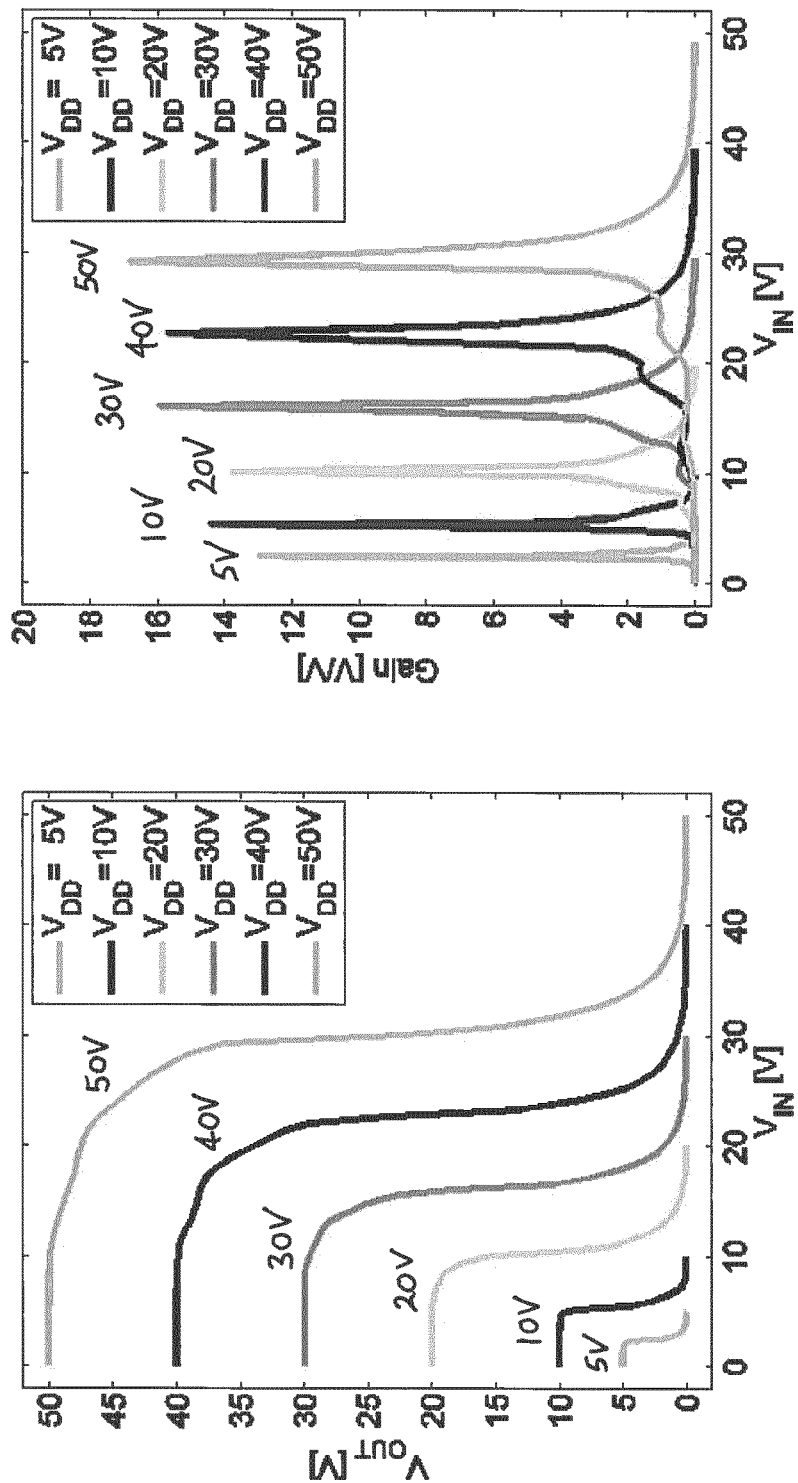
FIG. 15 shows the voltage transfer characteristic (VTC) and gain of a complementary inverter according to an embodiment of the invention at different power supply voltages.

FIG. 15 shows a voltage-transfer characteristic (VTC) measured for a complementary inverter made with the solution-based process described above. VTCs were measured for a range of power supply voltages going from 5V to 50V. Rail-to-rail operation is apparent, even for power supply voltages below 10V. Although the specific dielectric stack example does not use high-κ dielectric materials or a particularly thin dielectric thickness), the measured VTC reflects the strength of the complementary approach: as long as the n-type TFT has a much greater current capability than the p-type one, then for a logic high value at the input the output terminal will be driven to the logic low value, even if the transistors are operating in the subthreshold region (and a symmetric argument applies to the opposite set of logic values). The gain functions of the inverters are also shown in FIG. 15, indicating that a gain above 14V/V is consistently observed for power supply voltages greater than 10V. A peak gain of 16V/V is achieved for sufficiently high $V_{DD}$.

Figure 16:
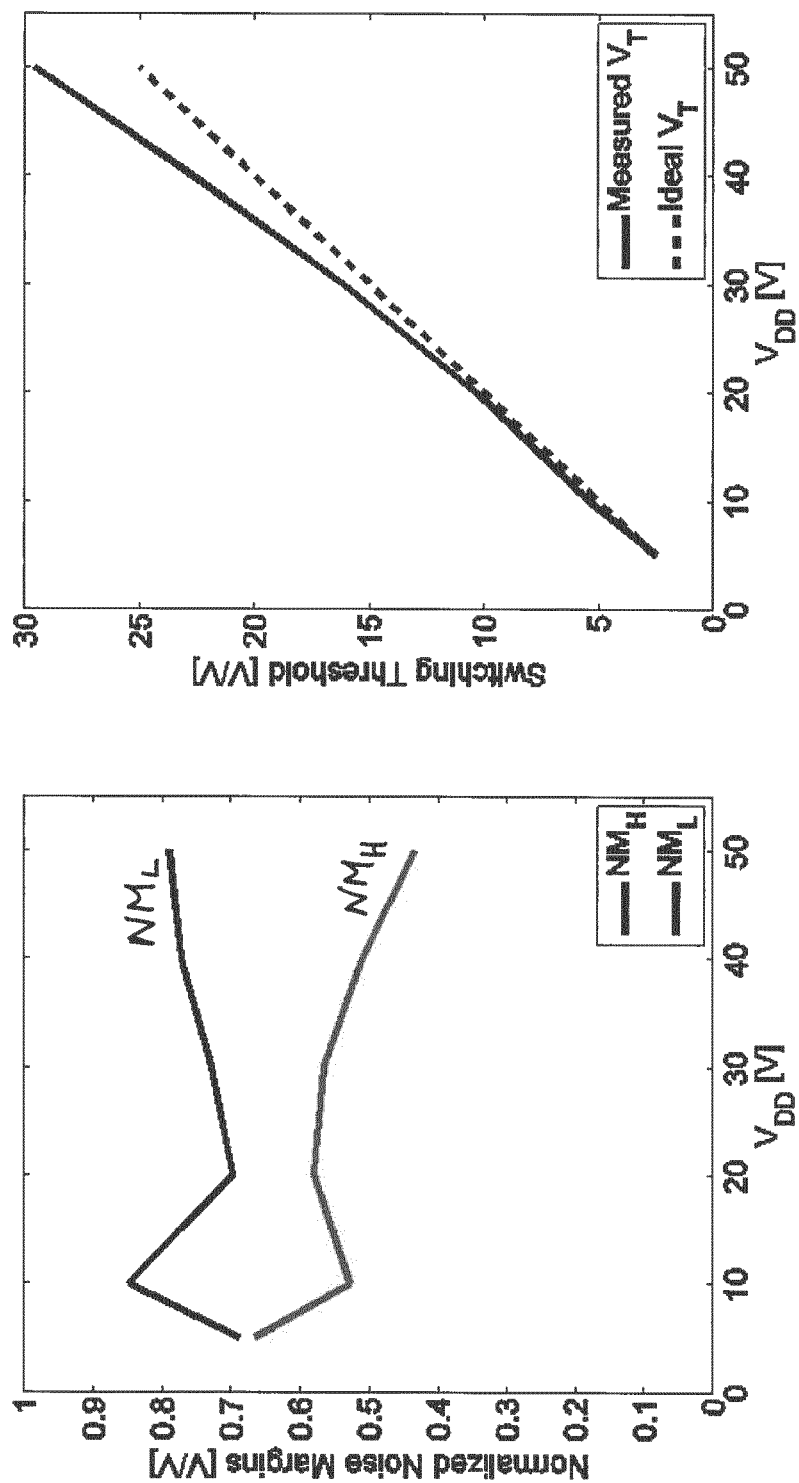
FIG. 16 shows the normalized noise margins and switching thresholds of a complementary inverter according to an embodiment of the invention at different power supply voltages.

The extracted noise margins (normalized with respect to the ideal value of $V_{DD}/2$) and switching threshold are shown in FIG. 16. The normalized noise margins are nearly constant and above 50% for most of the tested power supply voltage range, with the noise margin for high input being always higher than the one for low input and the gap becoming slightly larger at higher $V_{DD}$. As for the switching threshold, it stays quite close to the ideal value of $V_{DD}/2$ for all the tested power supply voltages, confirming that the two equally-sized TFTs in the inverter have symmetric current capabilities thanks to their similar mobilities.

Figure 17:
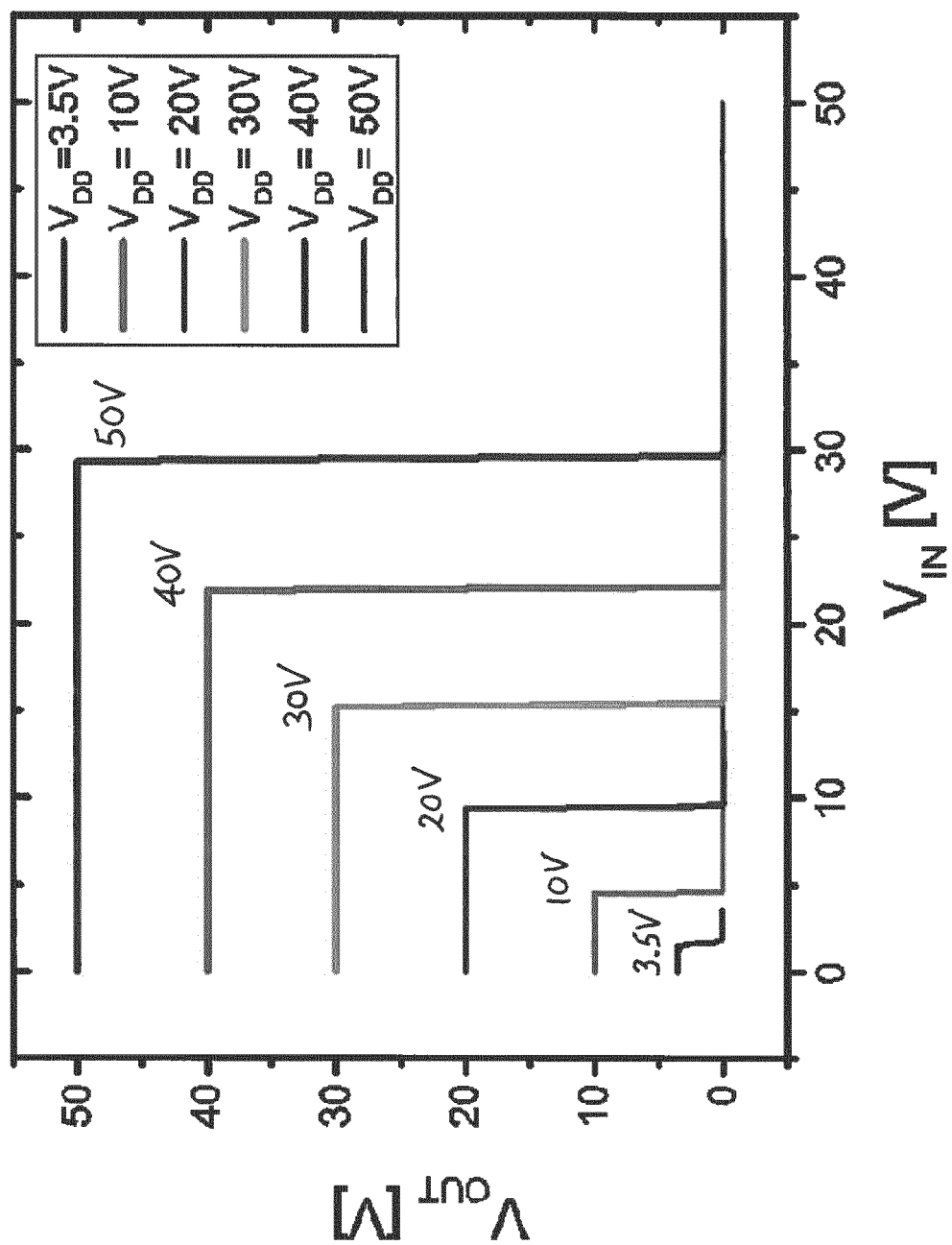
FIG. 17 shows the VTC of three-stage inverter chain according to an embodiment of the invention.
Figure 18:
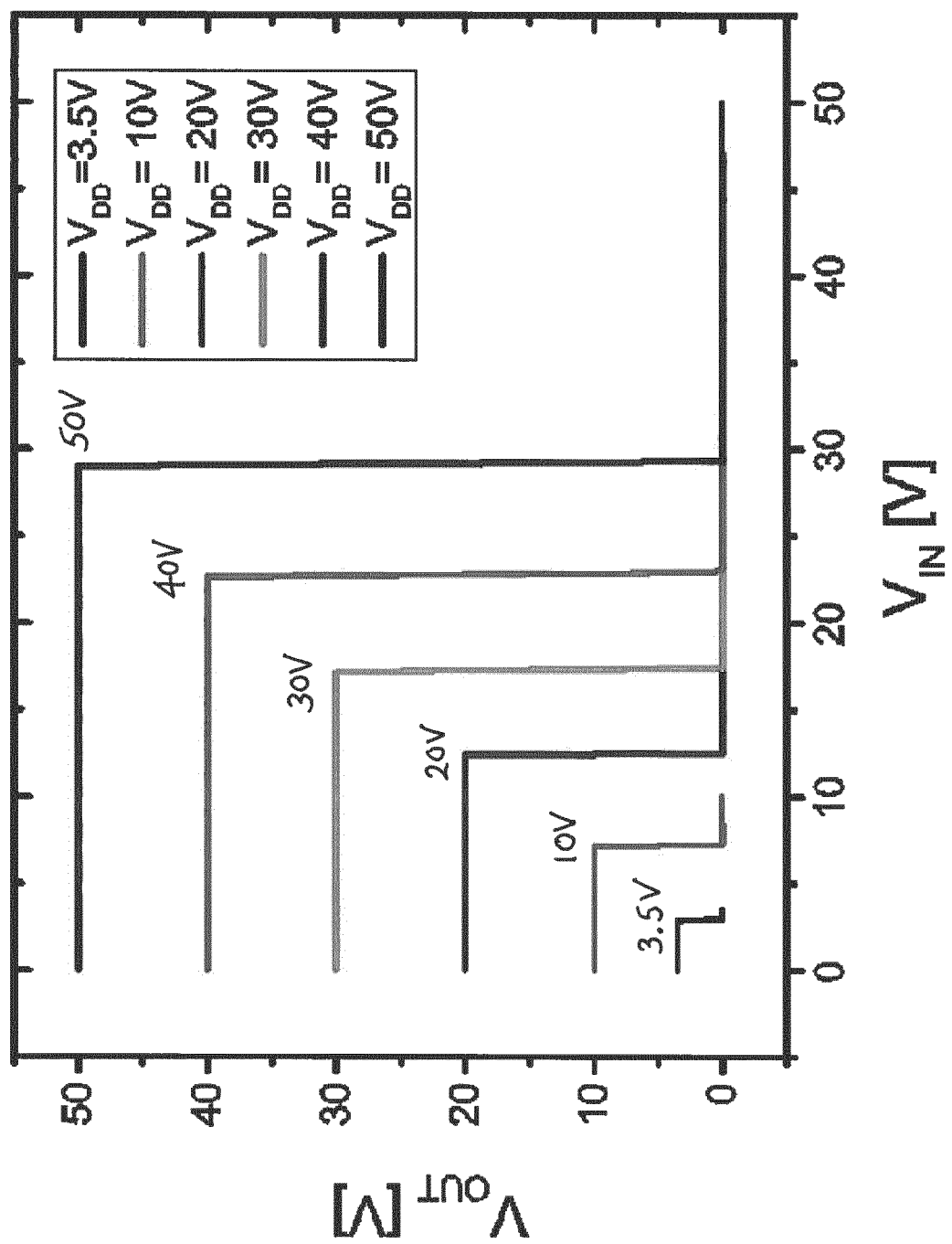
FIG. 18 shows the VTCs of a five-stage inverter chain according to an embodiment of the invention.

The large noise margins indicate that the above-described inverter according to an embodiment of the invention can drive a replica of itself. Indeed, this ability was demonstrated by fabricating inverter chains comprising up to five inverters of the same size. The VTCs of three-stage and five-stage inverter chains are shown in FIG. 17 and FIG. 18, respectively. These plots demonstrate that the above-described inverter according to an embodiment of the invention has switching capability down to a $V_{DD}$ of 3.5V, and confirm its robust noise margins. These VTCs exhibit sharp rail-to-rail transitions, with switching thresholds all nearly halfway the power supply voltage.

Figure 10:
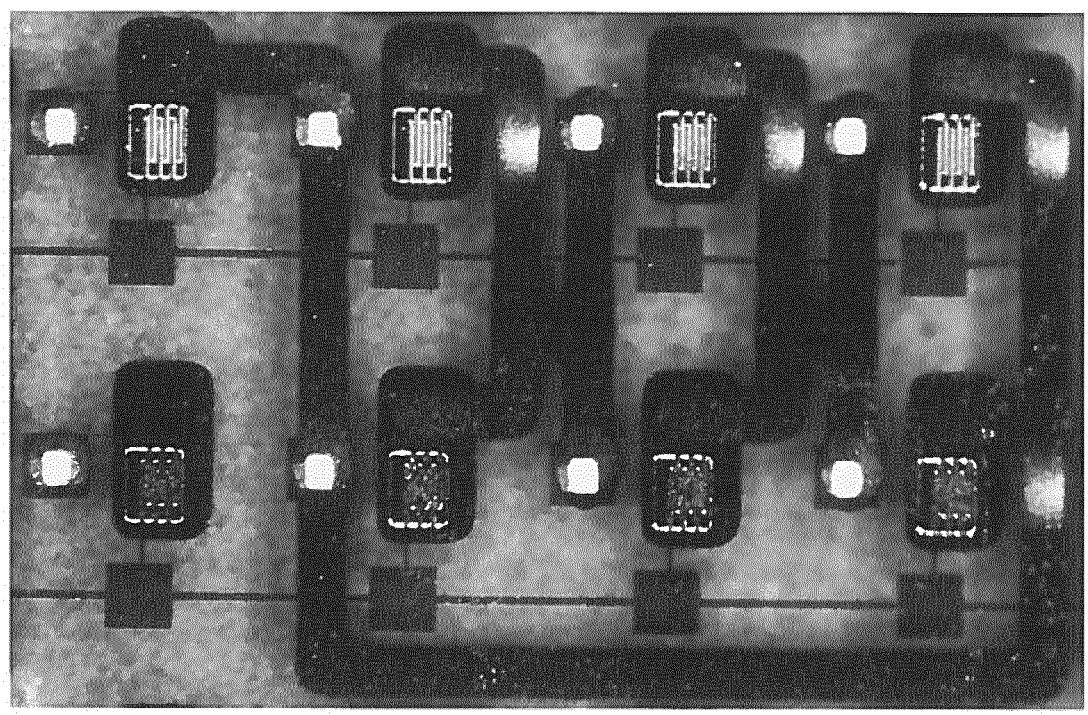
FIG. 10 shows the top-view of a circuit sample produced by a method according to an embodiment of the invention.
Figure 19:
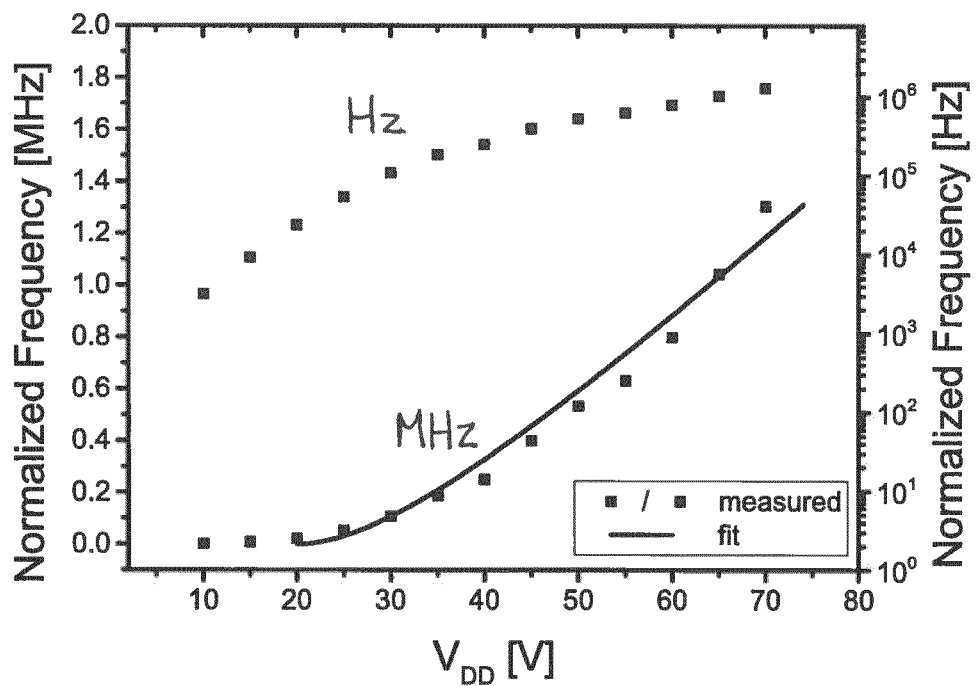
FIG. 19 shows the normalized oscillation frequency of a ring oscillator according to an embodiment of the present invention.

In order to assess the applicability of the above-described inverters according to an embodiment of the invention to the realization of fast complementary logic, ring-oscillator circuits were fabricated, which give a measure of the propagation delay of an inverter, namely the most basic indicator of the switching speed of a technology. In the fabricated ring oscillators, all equally-sized TFTs have an aspect ratio of 1000 μm/5 μm. The top view of a ring oscillator of this kind is shown in FIG. 10. The ring oscillators were characterized for a range of power-supply voltages going from 10V to 70V. In order to probe the oscillation frequency without interfering substantially with the ring oscillator operation, an additional p-type TFT was employed whose gate electrode was connected to a node of the ring oscillator. The introduced asymmetry in the loading of the inverters in the ring amounts only to the gate capacitance of an extra TFT, orders of magnitude lower than what would be contributed if a passive probe were connected to the same node to perform the measurement. The drain current of this additional TFT was then fed to an oscilloscope, by which the oscillation period of the ring could be monitored. FIG. 19 shows a representative plot of the normalized oscillation frequency versus power supply voltage of the inverters in the ring, derived from the measured oscillation through the equation f=2n/τ, where n is the number of stages of the ring (i.e., n=3 in this example) and r is the oscillation period. This plot shows that the normalized frequency has a quasi-linear dependence on the power supply voltage, and values in excess of 1 MHz are obtained for $V_{DD}$>60V. The observed performance is comparable to that has been achieved using UHV-evaporated organic semiconductors, and at least an order of magnitude faster than most all-organic solution-processed complementary implementations at equivalent channel lengths. This speed performance is also well aligned with the most performing hybrid implementation reported thus far, produced with ALD-deposited inorganic dielectric and AMOxS.

An approximate model for the switching of an inverter treats its transistors as constant current sources. Within this picture, for the potential at an inverter's output node to change by $V_{DD}/2$, it would take a time $$\tau \approx \frac{C_L V_{DD}}{\mu C_I \frac{W}{L}(V_{DD} - V_T)^2}$$

where it is assumed that the constant current provided by a transistor is equal to its saturation value. Here $C_L$ lumps the capacitive load of the inverter, and $C_I$ is the gate capacitance of its component transistors. By fitting the measured switching frequency to this formula, the red curve was obtained in FIG. 19, and an estimate of the capacitive load of the single inverter amounting to 50 pF. Given that in a ring oscillator each inverter is loaded with a replica of itself, and that the calculated input capacitance of an inverter in the ring is 16 pF ($2A_G C_I$, $A_G$ being the area over which the gate electrode is coupled to the semiconductor), the capacitive load inferred from the fitting procedure is indeed found to be reasonable. From this it is gathered that the self-loading in the inverters circuits according to an embodiment of the invention is minimal (i.e., the capacitance of the transistors in an inverter gives a negligible contribution to the inverter's capacitive load). Moreover, it is confirmed that the area of the self-aligned-gate windows is to be kept as small as possible to obtain a high switching speed.

Additionally, the semilogarithmic-scale trace in FIG. 19 shows that reasonably fast transitions (3.2 kHz at $V_{DD}$=10V) occur even at power supply voltages below the VT of the component TFTs (cf. FIG. 13 and FIG. 14). At such low voltages, however, the normalized switching frequency deviates from the basic formula above, confirming the subthreshold operation of the transistors in the oscillator. In fact, since the drain current exhibits an exponential dependence on the gate voltage in the subthreshold region, the propagation delay is expected to depend on the power supply voltage as $$\tau \approx \frac{V_{DD}}{e^{qV_{DD}/kT}}$$

which indeed conforms to the trend observed at low voltages in the semilogarithmic-scale trace in FIG. 19.

In addition to the modifications explicitly mentioned above, it will be evident to a person skilled in the art that various other modifications of the described embodiment may be made within the scope of the invention. The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method of producing a transistor device, comprising:
    forming a deposit of an oxide semiconductor channel material from a solution of a metal organic precursor,
    annealing the precursor film in the presence of water at a temperature between 150-350° C., and
    depositing an organic polymer gate dielectric on top of the oxide semiconductor channel,
    wherein said oxide semiconductor channel material comprises at least 10% of metal hydroxide species after deposition of the polymer gate dielectric.

2. The method according to claim 1, comprising depositing the organic polymer gate dielectric by a deposition process with a maximum processing temperature of less than 80° C.

3. The method of producing a transistor device according to claim 1, wherein said metal organic precursor is a metal alkoxide or a metal nitrate dissolved in an alcohol or water solvent.

* * * * *